(12) United States Patent
Misaka

(10) Patent No.: US 7,842,436 B2
(45) Date of Patent: Nov. 30, 2010

(54) PHOTOMASK

(75) Inventor: Akio Misaka, Osaka (JP)

(73) Assignee: Panasonic Corporation, Osaka (JP)

( * ) Notice: Subject to any disclaimer, the term of this patent is extended or adjusted under 35 U.S.C. 154(b) by 792 days.

(21) Appl. No.: 10/576,120

(22) PCT Filed: Sep. 21, 2004

(86) PCT No.: PCT/JP2004/014143

§ 371 (c)(1),
(2), (4) Date: Apr. 18, 2006

(87) PCT Pub. No.: WO2005/040919

PCT Pub. Date: May 6, 2005

(65) Prior Publication Data

US 2007/0065730 A1 Mar. 22, 2007

(30) Foreign Application Priority Data

Oct. 23, 2003 (JP) .......................... 2003-362717

(51) Int. Cl.
*G03F 1/00* (2006.01)
(52) U.S. Cl. .......................................... 430/5; 430/311
(58) Field of Classification Search .................. 430/5, 430/311; 716/19, 21
See application file for complete search history.

(56) References Cited

U.S. PATENT DOCUMENTS

| | | | | |
|---|---|---|---|---|
| 5,718,829 A | * | 2/1998 | Pierrat | 216/12 |
| 6,586,168 B1 | * | 7/2003 | Ohsaki | 430/394 |
| 6,703,168 B1 | | 3/2004 | Misaka | |
| 2002/0155362 A1 | * | 10/2002 | Heissmeier et al. | 430/5 |
| 2004/0029023 A1 | * | 2/2004 | Misaka | 430/5 |
| 2004/0121244 A1 | * | 6/2004 | Misaka | 430/5 |

FOREIGN PATENT DOCUMENTS

| | | |
|---|---|---|
| EP | 0 401 795 A2 | 12/1990 |
| JP | 3-170928 | 7/1991 |
| JP | 8-22114 | 1/1996 |
| JP | 2001-174974 | 6/2001 |
| WO | WO 01/35166 A1 | 5/2001 |
| WO | WO 02/091079 A1 | 11/2002 |
| WO | WO02/091079 A1 * | 11/2002 ................... 430/5 |

* cited by examiner

*Primary Examiner*—Mark F Huff
*Assistant Examiner*—Rashid Alam
(74) *Attorney, Agent, or Firm*—McDermott Will & Emery LLP

(57) ABSTRACT

A pattern 121 provided on a transparent substrate 100 as a mask pattern includes partial patterns 121A and 121B. Each of the partial patterns 121A and 121B has a mask enhancer structure including a phase shifter 102 for transmitting exposing light in an opposite phase with respect to a transparent portion and a shielding portion 101 surrounding the phase shifter 102. The partial pattern 121A is close to other patterns 122 and 123 at distances not larger than a given distance with the transparent portion sandwiched therebetween. The width of the phase shifter 102A of the partial pattern 121A is smaller than the width of the phase shifter 102B of the partial pattern 121B.

19 Claims, 18 Drawing Sheets

(a)

(b)

(c)

(a)

(b)

(a)

(b)

(a)

(b)

(a)

(b)

(a)

(b)

(a)

(b)

(c)

(d)

(a) GENERAL EXPOSURE
    LIGHT SOURCE (c) QUADRUPOLE EXPOSURE
    LIGHT SOURCE (b) ANNULAR EXPOSURE
    LIGHT SOURCE (d) ANNULAR/QUADRUPOLE
    EXPOSURE LIGHT SOURCE

// PHOTOMASK

This application is the U.S. National Phase under 35 U.S.C. §371 of International Application No. PCT/JP2004/014143, filed Sep. 21, 2004, which in turn claims the benefit of Japanese Application No. 2003-362717, filed Oct. 23, 2003, the disclosures of which Applications are incorporated by reference herein in their entirety.

TECHNICAL FIELD

The present invention relates to a photomask for use in forming a fine pattern in fabrication of a semiconductor integrated circuit device or the like and a design method for the same.

BACKGROUND ART

Recently, there are increasing demands for further refinement of circuit patterns for increasing the degree of integration of a large scale integrated circuit device (hereinafter referred to as the LSI) realized by using semiconductor. As a result, it has become very significant to thin an interconnect pattern included in a circuit.

Now, the thinning of an interconnect pattern by a conventional optical exposure system will be described on the assumption that positive resist process is employed. In this case, a line pattern means a portion of a resist film not exposed to exposing light, namely, a resist portion (a resist pattern) remaining after development. Also, a space pattern means a portion of the resist film exposed to the exposing light, namely, an opening portion (a resist removal pattern) formed by removing the resist through development. In the case where negative resist process is employed instead of the positive resist process, the definitions of the line pattern and the space pattern are replaced with each other.

When a pattern is formed by using the optical exposure system, a photomask in which a completely shielding pattern of Cr (chromium) or the like is drawn in accordance with a desired pattern on a transparent substrate (a permeable substrate) of quartz or the like is conventionally used. In such a photomask, a region where the Cr pattern exists is a shielding portion that does not transmit exposing light of a given wavelength at all (having transmittance of substantially 0%) and a region where no Cr pattern exists (an opening) is a transparent portion that has transmittance equivalent to that of the transparent substrate against the exposing light (having transmittance of substantially 100%). In the case where a wafer on which a resist is applied is subjected to exposure by using this photomask, the shielding portion corresponds to an unexposed portion of the resist and the opening (the transparent portion) corresponds to an exposed portion of the resist. Accordingly, such a photomask, namely, a photomask composed of a shielding portion and a transparent portion against exposing light of a given wavelength, is designated as a binary mask.

It is, however, difficult to form a fine pattern smaller than the exposure wavelength (the wavelength of the exposing light) by using the binary mask due to the diffraction phenomenon of light. Therefore, a mask pattern having a function to invert the phase of light, namely, a photomask provided with a phase shifter, is recently used. Furthermore, as a photomask for largely increasing the contrast and DOF (depth of focus) in fine pattern formation, a mask having a mask enhancer structure (an image enhancement mask) devised by the present inventor may be used in pattern formation. The mask enhancer structure basically includes a phase shifter and a shielding pattern such as a Cr pattern (see, for example, International Application PCT/JP00/07772 laid open in accordance with Patent Cooperation Treaty (International Publication No. WO 01/35166 A1), hereinafter referred to as Literature 1).

FIG. 19A shows an exemplified plane structure of an image enhancement mask, and FIG. 19B shows light amplitude intensity obtained through exposure of the mask of FIG. 19A on a material to be exposed in a position corresponding to a line AA'.

As shown in FIGS. 19A and 19B, a transparent phase shifter is provided within a pattern of a shielding film such as a Cr film (a shielding portion) in the image enhancement mask, so that the contrast in a light intensity distribution formed in the exposure can be enhanced.

The image enhancement mask of FIG. 19A is obtained by combining a mask shown in FIG. 19C in which a shielding portion (a shielding pattern) is surrounded with a transparent portion and a mask shown in FIG. 19D in which a phase shifter is surrounded with a shielding portion. FIG. 19E shows the light amplitude intensity obtained through the exposure of the masks of FIGS. 19C and 19D on materials to be exposed in positions corresponding to lines AA'.

As shown in FIGS. 19C and 19E, in the light intensity distribution formed in the case where a mask including a line-shaped shielding portion (specifically a Cr pattern) alone is used, as the line width of the Cr pattern is smaller, the light intensity obtained at the center of the Cr pattern (namely, the mask pattern center) is increased owing to light rounding the periphery of the Cr pattern. In other words, it cannot sufficiently shield the light although it is a shielding pattern. Accordingly, a sufficient shielding property cannot be realized, resulting in lowering the contrast in the light intensity distribution.

On the other hand, as shown in FIGS. 19D and 19E, in the case where a phase shifter for transmitting light in an opposite phase with respect to the transparent portion is used, if light passing through the phase shifter and light passing through the transparent portion can be made interfere with each other, these light cancel each other. Accordingly, with respect to a pattern having a line width too small to sufficiently shield light by using a Cr film, when a transparent phase shifter is formed within the Cr pattern, light passing through the phase shifter can be made to interfere with light passing through the transparent portion disposed around the Cr pattern and rounding to the back side of the Cr pattern, resulting in realizing a mask pattern having a very high shielding property. Such a structure in which a phase shifter for canceling light passing through a transparent portion is provided within a mask pattern with a shielding property is designated as a mask enhancer structure.

Although the mask enhancer structure is described to be composed of a shielding film such as a Cr film and a phase shifter in the above description, the equivalent effect can be attained when the shielding film is replaced with a semi-shielding film. A semi-shielding film partially transmits light, and light passing through the semi-shielding film and light passing through the transparent portion are in an identical phase.

Also, in pattern formation using a mask having the mask enhancer structure, the contrast in the light intensity distribution is increased/reduced as well as a process margin is increased/reduced in accordance with the combination of the width of the Cr film and the width of the phase shifter. The aforementioned Literature 1 discloses, as a method for increasing a process margin in formation of an isolated pattern, that a thin phase shifter is provided within a thick Cr pattern and a thick phase shifter is provided within a thin Cr pattern.

In the case where the mask enhancer structure is employed in a photomask including an isolated pattern alone, a large process margin can be attained by providing a thin phase shifter within a thick Cr pattern and a thick phase shifter within a thin Cr pattern as described above. However, in the case where the mask enhancer structure is employed in a photomask not only including an isolated pattern but also having complicated patterns mixedly having arbitrary pattern layouts, the process margin cannot be sufficiently increased simply by changing the width of the phase shifter in accordance with the width of the Cr pattern.

DISCLOSURE OF THE INVENTION

In consideration of the aforementioned disadvantage, an object of the invention is attaining an effect to sufficiently increase a process margin even when the mask enhancer structure is employed in a photomask having complicated patterns mixedly having arbitrary pattern layouts.

In the case where a pattern to be applied for the mask enhancer structure is close to another pattern, conditions for increasing a process margin are complicated for the following reason: Also in a general binary mask, when a target pattern is close to another pattern, the dimension and the shape of the mask should be changed in consideration of the close pattern. In general, such an operation is designated as OPC (optical proximity correction). Accordingly, it is difficult to increase a process margin in exposure using a photomask having complicated patterns mixedly having arbitrary pattern layouts simply by determining the architecture of the pattern having the mask enhancer structure on the basis of the line width of the pattern.

Therefore, the present inventor has variously examined a mask architecture capable of increasing a process margin even when a pattern to be applied for the mask enhancer structure is close to another pattern. As a result, it has been found that a process margin can be increased even in complicated patterns mixedly having arbitrary pattern layouts by employing a mask architecture in which the width of a phase shifter included in the mask enhancer structure of the pattern is made smaller as a distance from another close pattern is smaller.

The present invention was devised on the basis of the aforementioned finding, and specifically, the first photomask of this invention includes a mask pattern formed on a transparent substrate; and a transparent portion of the transparent substrate where the mask pattern is not formed, and the mask pattern includes a first pattern and a second pattern each having a mask enhancer structure including a phase shifter for transmitting exposing light in an opposite phase with respect to the transparent portion and a shielding portion surrounding the phase shifter, the first pattern is close to a third pattern included in the mask pattern at a distance not larger than a given distance with the transparent portion sandwiched therebetween, and a width of the phase shifter of the mask enhancer structure of the first pattern is smaller than a width of the phase shifter of the mask enhancer structure of the second pattern.

In the first photomask, the width of the phase shifter of the mask enhancer structure of the first pattern close to another pattern (the third pattern) at a distance not larger than the given distance is relatively small. Therefore, in accordance with the degree at which light (in an identical phase with respect to the transparent portion) rounding to the back side of the first pattern through the transparent portion disposed around the first pattern is reduced owing to the close pattern, light (in an opposite phase with respect to the transparent portion) passing through the inside (the phase shifter) of the first pattern can be reduced. Accordingly, the shielding property of the first pattern can be sufficiently improved, and hence, an exposure margin is increased and contrast in a light intensity distribution formed in the exposure is improved. In other words, also in a photomask including not only an isolated pattern but also complicated patterns close to one another, the effect to increase a process margin can be sufficiently attained by employing the mask enhancer structure. Also, since the width of the phase shifter of the mask enhancer structure can be optimized in accordance with the close relationship between patterns, a photomask capable of fine pattern formation with random pattern layout can be realized.

In the first photomask, each of the first and second patterns is, for example, a line pattern, and the mask pattern is composed of a shielding portion in the shape of the line pattern and a (line-shaped) phase shifter provided within the shielding portion. Also, when, for example, the first pattern is a line pattern, a third pattern may be present in a direction vertical to the line direction of the first pattern.

In the first photomask, each of regions of the transparent portion disposed on both sides of the second pattern may have a width larger than a given dimension. Alternatively, the second pattern may be isolated. Specifically, in the case where the second pattern is a line pattern, no other pattern may be present in a direction vertical to the line direction of the second pattern. In this case, the third pattern has the mask enhancer structure or is made of a shielding portion. However, the third pattern may be provided with a semi-shielding portion for partially transmitting the exposing light in an identical phase with respect to the transparent portion instead of the shielding portion of the mask enhancer structure.

In the first photomask, the second pattern may be close to a fourth pattern included in the mask pattern at a distance not larger than the given distance with the transparent portion sandwiched therebetween, and the distance between the second pattern and the fourth pattern may be larger than the distance between the first pattern and the third pattern. In this case, each of the third pattern and the fourth pattern has the mask enhancer structure or is made of a shielding portion. However, each of the third pattern and the fourth pattern may be provided with a semi-shielding portion for partially transmitting the exposing light in an identical phase with respect to the transparent portion instead of the shielding portion of the mask enhancer structure.

In the first photomask, the second pattern may be close to a fifth pattern included in the mask pattern at a distance equivalent to (including substantially equivalent to) the distance between the first pattern and the third pattern with the transparent portion sandwiched therebetween, the third pattern may have the mask enhancer structure, and the fifth pattern may be made of a shielding portion. In this case, the third pattern may be provided with a semi-shielding portion for partially transmitting the exposing light in an identical phase with respect to the transparent portion instead of the shielding portion of the mask enhancer structure.

In the first photomask, the first pattern and the second pattern may be connected to each other, thereby forming one continuous pattern. When, for example, the first and second patterns are line patterns, the first and second patterns may be connected to each other along the line direction.

In the first photomask, when the given distance is not larger than $(\lambda/NA) \times M$, wherein $\lambda$ indicates a wavelength of the exposing light and M and NA respectively indicate a reduction ratio and numerical aperture of a reduction projection optical system of a projection aligner, the aforementioned effects can be definitely attained.

In the first photomask, when each of the first pattern and the second pattern has a width not larger than $(0.8 \times \lambda/NA) \times M$, wherein $\lambda$ indicates a wavelength of the exposing light and M and NA respectively indicate a reduction ratio and numerical aperture of a reduction projection optical system of a projection aligner, the aforementioned effects can be definitely attained. In this case, even in the case where desired patterns (for example, resist patterns) to be formed by respectively transferring the first pattern and the second pattern onto a material to be exposed have the same width, the widths of the first pattern and the second pattern should not be always the same. However, a difference in the width between the first pattern and the second pattern is preferably not larger than $(0.2 \times \lambda/NA) \times M$. Thus, even when phase shifters having the same width are provided in the first pattern and the second pattern, sufficient contrast can be attained in the exposure of the respective patterns. In this case, a ratio of the width of the phase shifter of the mask enhancer structure of the first pattern to the width of the first pattern may be smaller than a ratio of the width of the phase shifter of the mask enhancer structure of the second pattern to the width of the second pattern.

In the first photomask, each of the first pattern and the second pattern may be provided with a semi-shielding portion for partially transmitting the exposing light in an identical phase with respect to the transparent portion instead of the shielding portion of the mask enhancer structure. In this case, the semi-shielding portion transmits the exposing light with a phase difference not less than $(-30+360 \times n)$ degrees and not more than $(30+360 \times n)$ degrees (wherein n is an integer) with respect to the transparent portion. In other words, an identical phase herein means a phase difference not less than $(-30+360 \times n)$ degrees and not more than $(30+360 \times n)$ degrees. Also, the semi-shielding portion is made of a metal thin film with a thickness of 30 nm or less.

In the first photomask, the phase shifter of the mask enhancer structure of each of the first pattern and the second pattern transmits the exposing light with a phase difference not less than $(150+360 \times n)$ degrees and not more than $(210+360 \times n)$ degrees (wherein n is an integer) with respect to the transparent portion. In other words, an opposite phase herein means a phase difference not less than $(150+360 \times n)$ degrees and not more than $(150+360 \times n)$ degrees.

In the first photomask, the phase shifter of the mask enhancer structure of each of the first pattern and the second pattern is preferably formed by trenching the transparent substrate.

Thus, transmittance equivalent to that of the transparent substrate (the transparent portion) (i.e., transmittance of substantially 100%) can be realized as the transmittance of the phase shifter.

The second photomask of this invention includes a mask pattern formed on a transparent substrate; and a transparent portion of the transparent substrate where the mask pattern is not formed, and the mask pattern includes a first pattern having a mask enhancer structure including a phase shifter for transmitting exposing light in an opposite phase with respect to the transparent portion and a shielding portion surrounding the phase shifter and a second pattern adjacent to the first pattern with the transparent portion sandwiched therebetween, and a width of the phase shifter of the mask enhancer structure of the first pattern is set to be smaller as a distance between the first pattern and the second pattern is smaller.

In the second photomask, the width of the phase shifter of the first pattern having the mask enhancer structure is reduced as the distance from the adjacent second pattern is smaller. Therefore, in accordance with the degree at which light (in an identical phase with respect to the transparent portion) rounding to the back side of the first pattern through the transparent portion disposed around the first pattern is reduced owing to the adjacent second pattern, light (in an opposite phase with respect to the transparent portion) passing through the inside of the first pattern (the phase shifter) can be reduced. Accordingly, the shielding property of the first pattern can be sufficiently improved, and hence, an exposure margin is increased and contrast in a light intensity distribution formed in the exposure is improved. In other words, also in a photomask including not only an isolated pattern but also complicated patterns close to one another, the effect to increase a process margin can be sufficiently attained by employing the mask enhancer structure. Also, since the width of the phase shifter of the mask enhancer structure can be optimized in accordance with the close relationship between patterns, a photomask capable of fine pattern formation with random pattern layout can be realized.

The third photomask of this invention includes a mask pattern formed on a transparent substrate; and a transparent portion of the transparent substrate where the mask pattern is not formed, and the mask pattern includes a first pattern having a mask enhancer structure including a phase shifter for transmitting exposing light in an opposite phase with respect to the transparent portion and a shielding portion surrounding the phase shifter and a second pattern adjacent to the first pattern with the transparent portion sandwiched therebetween, and a width of the phase shifter of the mask enhancer structure of the first pattern is set to be smaller when the second pattern has the mask enhancer structure than when the second pattern is made of a shielding portion.

In the third photomask, the width of the phase shifter of the first pattern having the mask enhancer structure is smaller when the adjacent second pattern has the mask enhancer structure than when the second pattern is made of a shielding portion. In other words, the width of the phase shifter of the first pattern is reduced as the shielding property of the second pattern is higher. Therefore, in accordance with the degree at which light (in an identical phase with respect to the transparent portion) rounding to the back side of the first pattern through the transparent portion disposed around the first pattern is reduced owing to the adjacent second pattern, light (in an opposite phase with respect to the transparent portion) passing through the inside of the first pattern (the phase shifter) can be reduced. Accordingly, the shielding property of the first pattern can be sufficiently improved, and hence, an exposure margin is increased and contrast in a light intensity distribution formed in the exposure is improved. In other words, also in a photomask including not only an isolated pattern but also complicated patterns close to one another, the effect to increase a process margin can be sufficiently attained by employing the mask enhancer structure. Also, since the width of the phase shifter of the mask enhancer structure can be optimized in accordance with the shielding property of the adjacent pattern, a photomask capable of fine pattern formation with random pattern layout can be realized.

The pattern formation method of this invention uses any of the aforementioned photomasks of the invention, and includes the steps of forming a resist film on a substrate; irradiating the resist film with the exposing light through the photomask; and forming a resist pattern by developing the resist film having been irradiated with the exposing light.

In the pattern formation method of this invention, the same effects as those attained by the aforementioned photomasks of this invention can be attained. Also, oblique incident illumination (off-axis illumination) is preferably employed in the step of irradiating the resist film with the exposing light. Thus, contrast between portions respectively corresponding to the mask pattern and the transparent portion can be improved in a light intensity distribution of light having passed through the photomask. Also, the focus characteristic of the light intensity distribution is improved. Accordingly, an exposure margin and a focus margin are increased in the pattern formation. In other words, fine pattern formation with a good defocus characteristic can be realized. Furthermore, even when patterns having the mask enhancer structure are close to each other on the photomask, the contrast of the respective patterns are largely improved in the exposure.

The mask data generation method of this invention for a photomask including a mask pattern formed on a transparent substrate and a shielding portion of the transparent substrate where the mask pattern is not formed, includes the steps of generating a pattern corresponding to a desired unexposed region of a resist formed by irradiating the resist with exposing light through the photomask; determining a shape of a phase shifter disposed within the pattern for transmitting the exposing light in an opposite phase with respect to the transparent portion; adjusting a width of the phase shifter on the basis of a distance from the pattern to a different pattern close to the pattern with the transparent portion sandwiched therebetween; setting an edge of the pattern corresponding to a boundary with the transparent portion as a CD adjustment edge; predicting a dimension of a resist pattern formed by using the pattern including the phase shifter through simulation; and when the predicted dimension of the resist pattern does not accord with a desired dimension, deforming the pattern by moving the CD adjustment edge.

In the mask data generation method of this invention, the width of the phase shifter of the mask enhancer structure is adjusted on the basis of a distance from the different close pattern to the pattern having the mask enhancer structure (the target pattern). Therefore, by, for example, reducing the width of the phase shifter as the distance from the different pattern is smaller, light (in an opposite phase with respect to the transparent portion) passing through the inside of the target pattern (the phase shifter) can be reduced in accordance with the degree at which light (in an identical phase with respect to the transparent portion) rounding to the back side of the target pattern through the transparent portion disposed around the target portion is reduced owing to the different pattern. Accordingly, the shielding property of the target pattern can be sufficiently improved, and hence, an exposure margin is increased and contrast in a light intensity distribution formed in the exposure is improved. In other words, also in a photomask including not only an isolated pattern but also complicated patterns close to one another, the effect to increase a process margin can be sufficiently attained by employing the mask enhancer structure. Also, since the width of the phase shifter of the mask enhancer structure can be optimized in accordance with the close relationship between patterns, a photomask capable of fine pattern formation with random pattern layout can be realized.

In the mask data generation method of the invention, the pattern may include a semi-shielding portion for transmitting the exposing light in an identical phase with respect to the transparent portion.

In the mask data generation method of the invention, the step of determining a shape of a phase shifter preferably includes the sub-steps of setting at least two or more different widths as a width of the phase shifter; and setting the width of the phase shifter to be larger when the pattern has a small width not larger than a given width than when the pattern has a width larger than the given width.

Thus, a process margin in forming an isolated pattern can be increased.

In the mask data generation method of the invention, the step of adjusting a width of the phase shifter preferably includes the sub-steps of setting at least two or more different widths as the width of the phase shifter; and setting the width of the phase shifter to be smaller when the distance between the pattern and the different pattern is not larger than a given dimension than when the distance between the pattern and the different pattern is larger than the given dimension.

Thus, the aforementioned effects of the mask data generation method of this invention can be definitely attained.

In the mask data generation method of the invention, the step of adjusting a width of the phase shifter preferably includes the sub-steps of setting at least two or more different widths as the width of the phase shifter; and setting the width of the phase shifter to be smaller when the pattern is close to the different pattern at a distance not larger than a given dimension and the different pattern includes a different phase shifter than when the pattern is close to the different pattern at a distance not larger than the given dimension and the different pattern does not include a different phase shifter.

Thus, since the width of the phase shifter of the target pattern is reduced as the shielding property of the different pattern is higher, light (in an opposite phase with respect to the transparent portion) passing through the inside of the target pattern (the phase shifter) can be reduced in accordance with the degree at which light (in an identical phase with respect to the transparent portion) rounding to the back side of the target pattern through the transparent portion disposed around the target portion is reduced owing to the different pattern. Accordingly, the aforementioned effects of the mask data generation method of this invention can be definitely attained.

In the mask data generation method of the invention, the different pattern may include two patterns close to respective sides of the pattern, and the step of adjusting a width of the phase shifter may include sub-steps of setting at least two or more different widths as the width of the phase shifter; obtaining distances S1 and S2 respectively from the two patterns close to the respective sides of the pattern to the pattern; and setting the width of the phase shifter to be smaller when (S1+S2)/2 is not larger than a given value than when (S1+S2)/2 is larger than the given value. Also in this case, the aforementioned effects of the mask data generation method of this invention can be definitely attained.

As described so far, according to the present invention, the effects to improve contrast in a light intensity distribution and to increase a process margin can be sufficiently attained by employing the mask enhancer structure also in a photomask including not only an isolated pattern but also complicated patterns close to one another. Also, since the width of the phase shifter of the mask enhancer structure can be optimized in accordance with the close relationship between patterns or the shielding property of an adjacent pattern, a photomask capable of fine pattern formation with random pattern layout can be realized.

BEST MODE FOR CARRYING OUT THE INVENTION

Prerequisites

Prerequisites for describing preferred embodiments of the invention will be first described.

Since a photomask is generally used in a reduction projection type aligner, it is necessary to consider a reduction ratio in arguing a pattern dimension on the mask. However, in order to avoid confusion, in the description of each embodiment below, when a pattern dimension on a mask is mentioned in correspondence to a desired pattern to be formed (such as a resist pattern), a value obtained by converting the pattern dimension by using a reduction ratio is used unless otherwise mentioned. Specifically, also in the case where a resist pattern with a width of 100 nm is formed by using a mask pattern with a width of M×100 nm in a 1/M reduction projection system, the width of the mask pattern and the width of the resist pattern are both described as 100 nm.

Also, in each embodiment of the invention, M and NA respectively indicate a reduction ratio and numerical aperture of a reduction projection optical system of an aligner and $\lambda$ indicates the wavelength of exposing light unless otherwise mentioned.

Moreover, pattern formation is described on the assumption that the positive resist process for forming a resist pattern correspondingly to an unexposed region is employed. In the case where the negative resist process is employed, since a shielded region of a resist is removed, a resist pattern of the positive resist process is replaced with a space pattern.

Moreover, a photomask described in each embodiment is assumed to be a transmission mask. In the case where the photomask is applied to a reflection mask, since a transparent region and a shielding region of a transmission mask respectively correspond to a reflection region and a non-reflection region, the transmission phenomenon is replaced with the reflection phenomenon. Specifically, a transparent portion or a transparent region is replaced with a reflection portion or a reflection region, and a shielding portion is replaced with a non-reflection portion. Furthermore, a region partially transmitting light is replaced with a portion partially reflecting light, and transmittance is replaced with reflectance.

Mask Enhancer

Next, a mask enhancer described in each embodiment of the invention will be simply explained (see detailed explanation in the aforementioned Literature 1).

Figure 1:
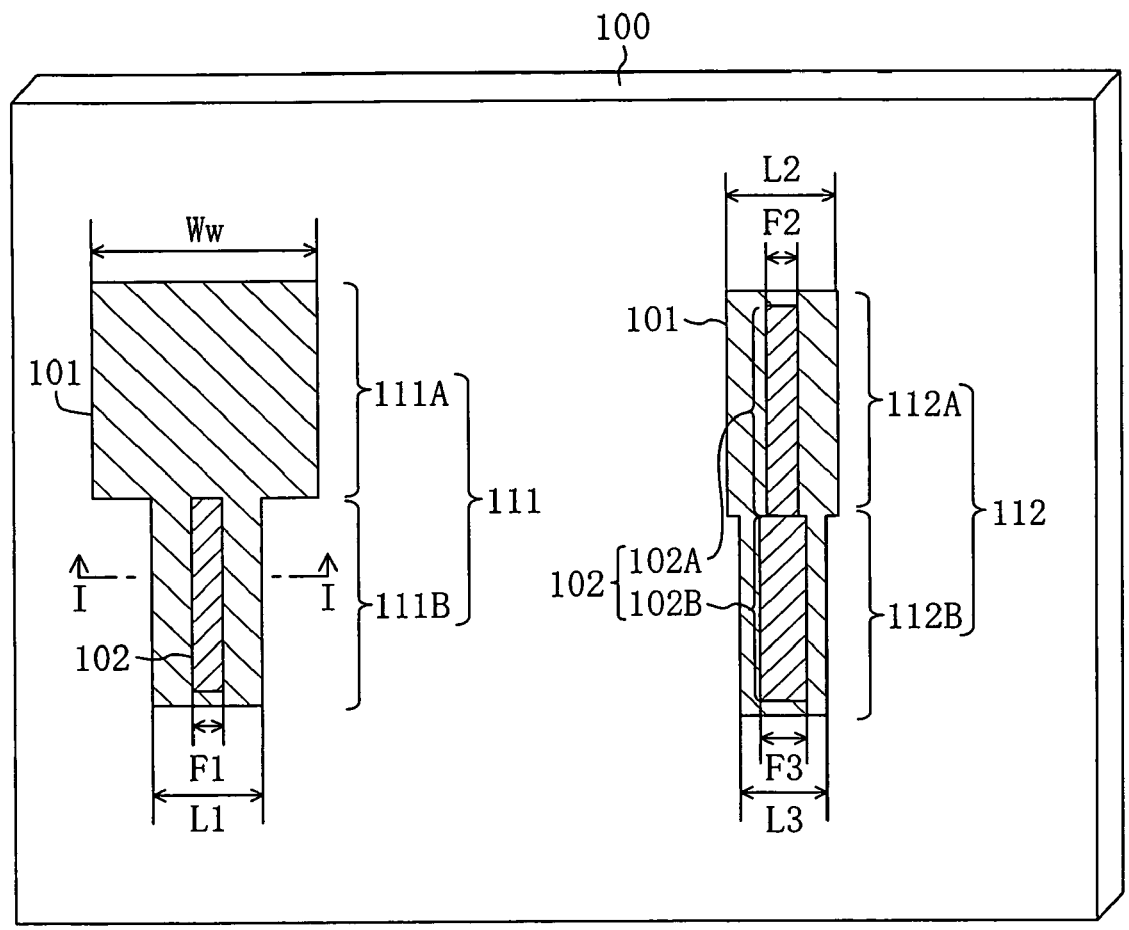
FIG. 1A is a plan view of a photomask employing a mask enhancer according to the invention.
FIGS. 1B and 1C are cross-sectional views taken on line I-I of FIG. 1A.
Figure 1:
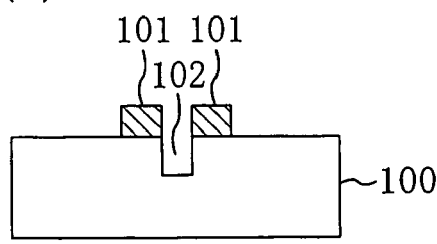
Figure 1:
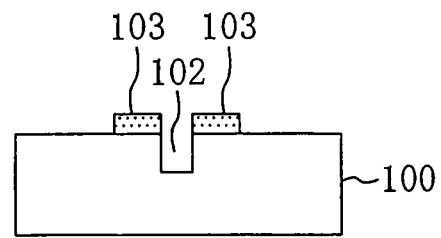

FIG. 1A is a diagram for explaining the mask enhancer (a plan view of a photomask provided with a mask pattern having a mask enhancer structure), and FIGS. 1B and 1C are variations of a cross-sectional view taken on line I-I of FIG. 1A. It is noted that a transparent substrate 100 is perspectively shown in FIG. 1A.

As shown in FIG. 1A, mask patterns (patterns 111 and 112) used for forming desired line-shaped patterns on a wafer through exposure are drawn on the transparent substrate 100. At this point, each mask pattern is a shielding pattern for forming a shielded region on the wafer in a position corresponding to the mask pattern through the exposure performed by using the photomask. Also, a portion of the transparent substrate 100 in which no mask pattern is formed corresponds to a transparent portion (an opening).

Herein, a line-shaped pattern means a rectangular region with a length (a dimension on the wafer) not smaller than twice of the exposure wavelength (of, for example, 193 nm when the exposing light is Ar excimer laser) and is not limited to a pattern in the shape of a line as a whole. In other words, in an arbitrary pattern including the aforementioned rectangular region, the rectangular region alone is dealt with as a line-shaped pattern. In a light intensity distribution formed in the exposure of a shielding pattern of a line-shaped pattern, in order that a light intensity distribution obtained in the vicinity of the center of the line-shaped pattern having a finite length is equivalent to a light intensity distribution of a line-shaped pattern having an infinite length, the line-shaped pattern having a finite length should have a length not smaller than twice of the exposure wavelength. In other words, a line-shaped pattern having a length not smaller than twice of the exposure wavelength can be dealt with as a line-shaped pattern having an infinite length.

Figure 2:
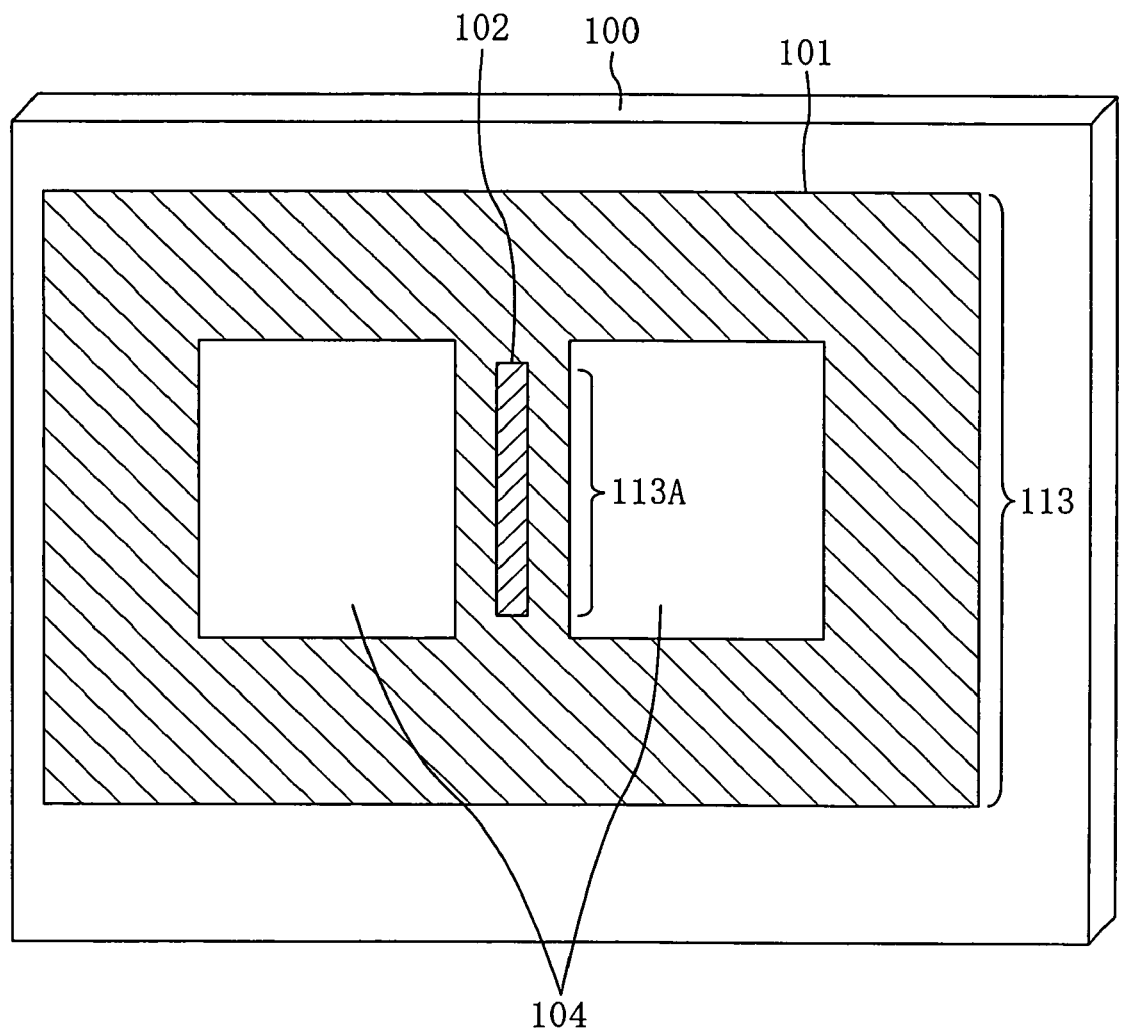
FIG. 2 is a plan view of another photomask employing the mask enhancer according to the invention.

FIG. 2 shows an example of a pattern including a rectangular region having a length not smaller than twice of the exposure wavelength. In FIG. 2, like reference numerals are used to refer to like elements used in the photomask of FIG. 1A so as to omit the description. As shown in FIG. 2, in a frame-like pattern 113 surrounding transparent portions 104 (more precisely, part of the transparent portions), when there is a partial pattern 113A (a partial pattern sandwiched between a pair of transparent portions 104) corresponding to a rectangular region having a length not smaller than twice of the exposure wavelength, the partial pattern 113A is designated as a line-shaped pattern.

Each of the patterns 111 and 112 corresponding to the mask patterns is composed of a shielding portion 101 alone or a combination of a shielding portion 101 and a phase shifter 102. The shielding portion 101, namely, a shielding film, is made of a shielding material, such as Cr, minimally transmitting light. On the other hand, the phase shifter 102 transmits light, and between light passing through the phase shifter 102 and light passing through the transparent portion, there is an opposite phase relationship (specifically, a relationship with a phase difference not less than (150+360×n) degrees and not more than (210+360×n) degrees (wherein n is an integer)). In the following description, a simply mentioned phase shifter has transmittance equivalent to that of a transparent portion unless otherwise mentioned. However, the transmittance of the phase shifter 102 is not limited to 100% but the phase shifter 102 has transmittance at least 20% or more and preferably has high transmittance of 50% or more.

As shown in FIG. 1A, each of the patterns 111 and 112 is a pattern isolatedly present on the transparent substrate 100. At this point, being isolatedly present means being affected by none of other patterns in the exposure, and specifically means that none of the other patterns is present at a distance not larger than 2×λ/NA corresponding to a distance where the influence of interference can be optically ignored, namely, no other pattern is close.

It is herein determined whether or not a pattern is isolated merely on the basis of a target line-shaped rectangular region. In other words, there is a case where a given pattern is isolated although it is not completely separated from another pattern. Specifically, for example, in the pattern 113 shown in FIG. 2, when the line-shaped partial pattern 113A is sandwiched between the transparent portions 104 each with a width larger than the dimension where the influence of the interference can be optically ignored (namely, 2×λ/NA), the line-shaped partial pattern 113A is regarded to be isolated.

Furthermore, as shown in FIG. 1A, the pattern 111 is composed of a partial pattern 111A with a line width Ww larger than a given dimension W0 (Ww>W0) and a partial pattern 111B with a line width L1 not larger than the given width W0 (W0>L1). Also, a phase shifter 102 with a line width F1 is provided at the center of the partial pattern 111B. In other words, the pattern 111 includes a region corresponding to a shielding portion 101 in the shape of the pattern 111 and a region corresponding to the phase shifter 102 provided in an opening formed within the shielding portion 101. Moreover, as shown in FIG. 1B, the shielding portion 101 is made of a shielding film and the phase shifter 102 can be formed by trenching the transparent substrate 100 in the opening of the shielding film. This is the most preferable structure for realizing a phase shifter having transmittance equivalent to that of the transparent portion. When such a phase shifter having sufficiently high transmittance is used, parameters indicating satisfactoriness of the pattern formation characteristics, such as an exposure margin and a depth of focus, can be largely improved. However, the cross-sectional structure for providing the phase shifter 102 at the center of the shielding portion 101 is not limited to that shown in FIG. 1B. It is hereinafter assumed, unless otherwise mentioned, that the outermost region of each pattern used as a mask pattern is made of a shielding portion and that the line width of each pattern is defined as a distance from a boundary between one end of the shielding portion of the outermost region and a transparent portion to a boundary between the other end of the shielding portion of the outermost region and the transparent portion, namely, as the width of the whole pattern.

In general, it is experimentally known that a dimension where light rounding the periphery of a mask pattern through diffraction cannot be ignored is approximately 0.8×λ/NA. Accordingly, when a mask pattern with a width not smaller than 0.8×λ/NA is made of a shielding portion alone, a sufficiently high shielding property can be realized, and hence, high contrast can be attained in a light intensity distribution formed in the exposure. However, in the case where a mask pattern having a width not larger than 0.8×λ/NA is made of a shielding portion alone, a sufficient shielding property cannot be attained due to diffracted light rounding beneath the mask pattern through a transparent portion disposed around the mask pattern, and as a result, contrast in a light intensity distribution formed in the exposure is lowered.

At this point, when light in the relationship of an opposite phase with the diffracted light rounding through the transparent portion can be set to pass through the center of the mask pattern, these lights interfere with each other so as to be mutually cancelled. Accordingly, when a phase shifter is provided at the center of the mask pattern (i.e., the shielding pattern) with a width not larger than 0.8×λ/NA, the shielding property can be improved, resulting in realizing high contrast in the formation of the pattern with a fine line width. This is the principal of the mask enhancer, and the structure in which a phase shifter is provided at the center of a shielding pattern having a width not larger than 0.8×λ/NA is designated as the mask enhancer structure. However, when a phase shifter is provided at the center of a mask pattern formed as a shielding portion having a width exceeding 0.8×λ/NA, the shielding property is lowered on the contrary. This is for the following reason: In the case where diffracted light rounding the periphery of a mask pattern is minimally present, when light in the relationship of the opposite phase with the diffracted light passes through the mask pattern, the light in the opposite phase is excessive in the event.

Furthermore, although the upper limit of the dimension where the shielding property of a shielding pattern can be improved by providing a phase shifter at the center of the shielding pattern is 0.8×λ/NA, a dimension where the shielding property of a shielding pattern can be remarkably improved by providing a phase shifter is 0.6×λ/NA or less.

As described above, in order to realize a photomask capable of fine pattern formation by employing the mask enhancer structure, the aforementioned given dimension W0 should be 0.8×λ/NA or less and is more preferably 0.6×λ/NA or less. Also, since a dimension where the pattern formation using a shielding pattern is very difficult due to the diffraction is 0.3×λ/NA the given dimension W0 is preferably 0.3×λ/NA or more.

Furthermore, as shown in FIG. 1A, the pattern 112 is composed of a partial pattern 112A with a line width L2 not larger than the given dimension W0 (W0>L2) and a partial pattern 112B with a line width L3 not larger than the given dimension W0 (W0>L3). Also, similarly to the pattern 111, the pattern 112 includes a region corresponding to a shielding portion (shielding film) 101 in the shape of the pattern 112 and a region corresponding to a phase shifter 102 provided in an opening of the shielding portion 101. Moreover, a phase shifter 102A with a line width F2 is provided at the center of the partial pattern 112A, and a phase shifter 102B with a line width F3 is provided at the center of the partial pattern 112B. In other words, each of the partial patterns 112A and 112B has the mask enhancer structure. At this point, among the pattern widths L2 and L3 of the partial patterns 112A and 112B and a given dimension WI, there is a relationship of W0≧L2>W1≧L3. Between the line widths F2 and F3 of the phase shifters 102A and 102B, there is a relationship of F3>F2.

In general, the diffracted light rounding to the back side of a mask pattern through a transparent portion disposed around the mask pattern due to the diffraction is increased as the line width of the mask pattern is reduced. Accordingly, in the mask enhancer structure, as the line width of a mask pattern is reduced, the width of a phase shifter used for canceling the light rounding to the back side of the mask pattern due to the diffraction is preferably increased. In this manner, also in a mask pattern composed of a plurality of partial patterns with different line widths, all the partial patterns can attain a high shielding property, resulting in realizing a photomask that can attain high contrast in a light intensity distribution formed in the exposure. In this case, although a plurality of partial patterns with different line widths included in one pattern are exemplified, a similar architecture (in which the width of a phase shifter is increased as the line width of a pattern is reduced) is preferably employed for a plurality of different patterns formed isolatedly on one transparent substrate. Specifically, in the architecture shown in FIG. 1A, in the case where there is a relationship of W0≧L1>W1≧L3 between the line width L1 of the partial pattern 111B of the pattern 111 and the line width L3 of the partial pattern 112B of the pattern 112, there is a relationship of F3>F1 between the line width F1 of the phase shifter 102 of the partial pattern 111B and the line width F3 of the phase shifter 102B of the partial pattern 112B.

In the case where a difference in the line width between respective patterns is so small that a difference in the intensity of the diffracted lights rounding the peripheries of the respective patterns can be ignored, phase shifters provided at the centers of the respective patterns may have the same width. Specifically, in the architecture shown in FIG. 1A, in the case where there are relationships of W0≧L1>W1 and W0≦L2>W1 between the line width L1 of the partial pattern 111B of the pattern 111 and the line width L2 of the partial pattern 112A of the pattern 112, there may be a relationship of F2=F1 between the line width F1 of the phase shifter 102 of the partial pattern 111B and the line width F2 of the phase shifter 102A of the partial pattern 112A.

As described so far, when the mask enhancer structure is employed in mask patterns isolatedly present, all the isolated mask patterns can attain a high shielding property, and therefore, a photomask that can attain a light intensity distribution with high contrast can be realized. In other words, a photomask good at fine pattern formation can be realized.

Although the mask enhancer structure is composed of a shielding film such as a Cr film and a phase shifter in the above description, a similar effect can be attained even when a shielding portion 101 made of a shielding film is replaced with a semi-shielding portion 103 made of a semi-shielding film as shown in FIG. 1C. A difference between FIG. 1B and FIG. 1C is the replacement of the shielding portion (the shielding film) 101 for the semi-shielding portion (the semi-shielding film) 103. The semi-shielding portion 103 partially transmits the exposing light in an identical phase with respect to the transparent portion. Specifically, there is an identical phase relationship (specifically, a relationship with a phase difference not less than (−30+360×n) degrees and not more than (30+360×n) degrees (wherein n is an integer)) between light passing through the semi-shielding portion 103 and light passing through the transparent portion, whereas the semi-shielding portion 103 preferably has transmittance of 15% or less. In this manner, the light passing through the mask pattern can be prevented from being too excessive to expose a resist. As the semi-shielding film used to form such a semi-shielding portion 103, a metal thin film with a thickness of, for example, 30 nm or less can be used. The metal thin film can be a thin film (with a thickness of 30 nm or less) made of any of metals such as chromium (Cr), tantalum (Ta), zirconium (Zr), molybdenum (Mo) and titanium (Ti) or an alloy of any of these metals. Specific examples of the alloy are Ta—Cr alloy, Zr—Si alloy, Mo—Si alloy and Ti—Si alloy.

Furthermore, when the semi-shielding portion 103 is used instead of the shielding portion 101 as described above, the shielding property of a mask pattern with a line width exceeding 0.8×λ/NA can be improved by employing the mask enhancer structure. This is for the following reason: Since light passing through a mask pattern with a width exceeding 0.8×λ/NA is in the identical phase to light passing through the transparent portion, light in the opposite phase can be prevented from being excessive by providing a phase shifter within the pattern. However, the effect attained when the semi-shielding portion 103 is used in a mask pattern having a line width not larger than 0.8×λ/NA is completely the same as the effect attained by using the shielding portion 101.

In each of embodiments described below, the architecture of a mask enhancer structure employed when a mask pattern to be applied for the mask enhancer structure is close to another pattern will be described.

EMBODIMENT 1

A photomask according to Embodiment 1 of the invention will now be described with reference to the accompanying drawings.

Figure 3:
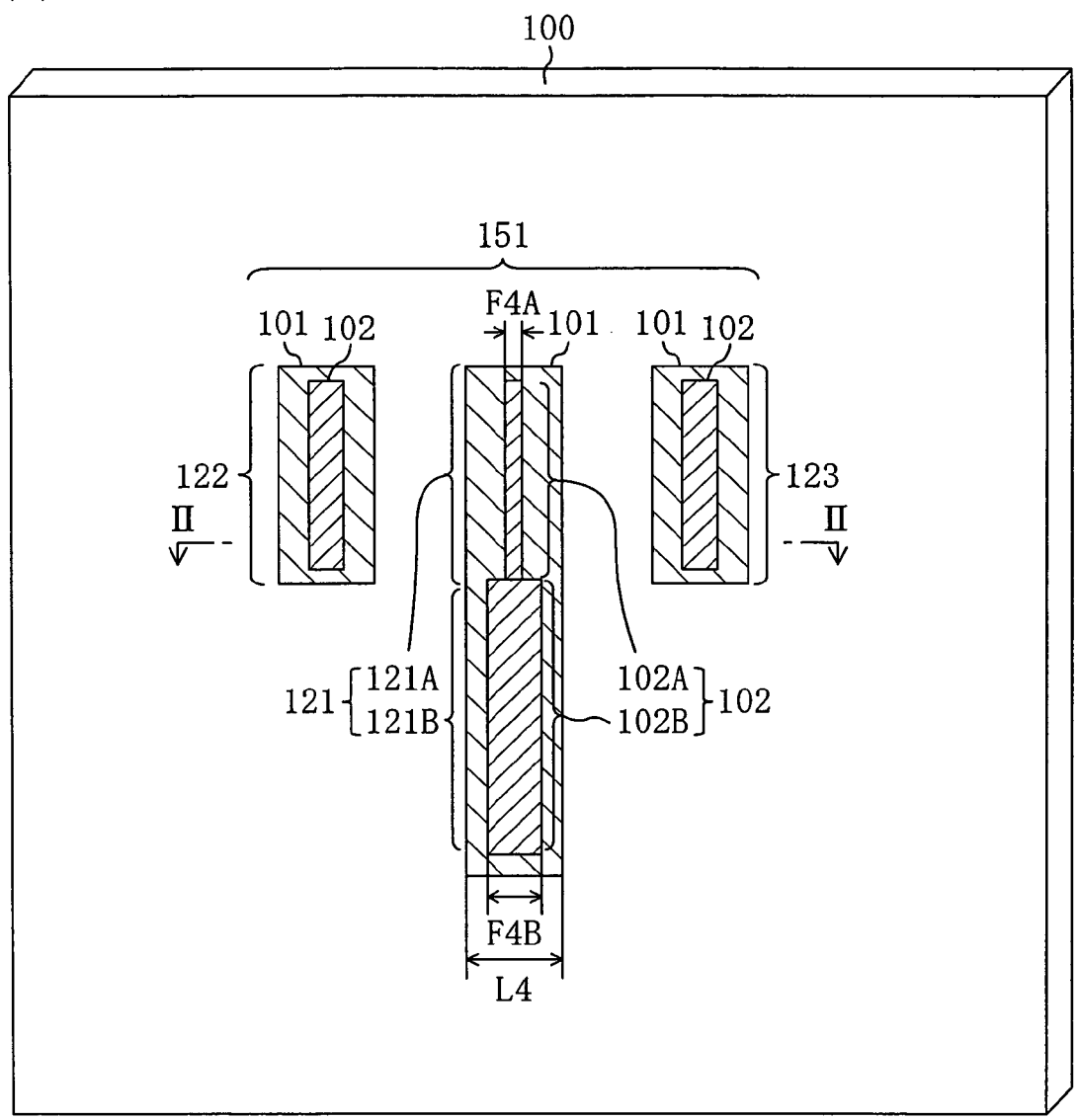
FIG. 3A is a plan view of a photomask according to Embodiment 1 of the invention and FIG. 3B is a cross-sectional view taken on line II-II of FIG. 3A.
Figure 3:
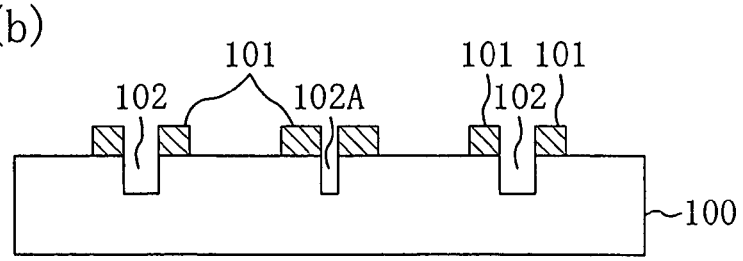

FIG. 3A is a plan view of the photomask of Embodiment 1 and FIG. 3B is a cross-sectional view taken on line II-II of FIG. 3A. It is noted that a transparent substrate 100 is perspectively shown in FIG. 3A.

As shown in FIG. 3A, mask patterns (line patterns 121 through 123) used for forming desired line-shaped patterns on a wafer through exposure are drawn on the transparent substrate 100. At this point, each of the line patterns 121 through 123 is basically made of a shielding portion 101. Also, in a central portion of a pattern region with a line width not larger than a given dimension W0 in each of the line patterns 121 through 123, the shielding portion 101 has an opening in which a phase shifter 102 is provided. In other words, each of the line patterns 121 through 123 has the mask enhancer structure. For example, the pattern 121 is a pattern with a line width L4 satisfying a relationship of W2≧L4>W3 wherein W2 and W3 are given dimensions satisfying a relationship of W0≧W2>W3, and a phase shifter 102 is provided at the center of the pattern 121.

Also, as shown in FIG. 3A, the pattern 121 is composed of a partial pattern 121A close to the other patterns 122 and 123 at a distance not larger than a given distance S0 with a transparent portion sandwiched therebetween along a direction vertical to the line direction thereof and a partial pattern 121B not close to another pattern at a distance not larger than the given distance S0 along the vertical direction (i.e., being isolated). It is noted that the partial pattern 121A and the patterns 122 and 123 sandwiching the partial pattern 121A together form densely arranged patterns 151. Also, a phase shifter 102A with a line width F4A is provided at the center of the partial pattern 121A and a phase shifter 102B with a line width F4B is provided at the center of the partial pattern 121B. In other words, each of the partial patterns 121A and 121B has the mask enhancer structure. At this point, the phase shifter 102A of the partial pattern 121A included in the densely arranged patterns 151 has a smaller width than the phase shifter 102B of the isolated partial pattern 121B, namely, F4B>F4A.

Figure 4:
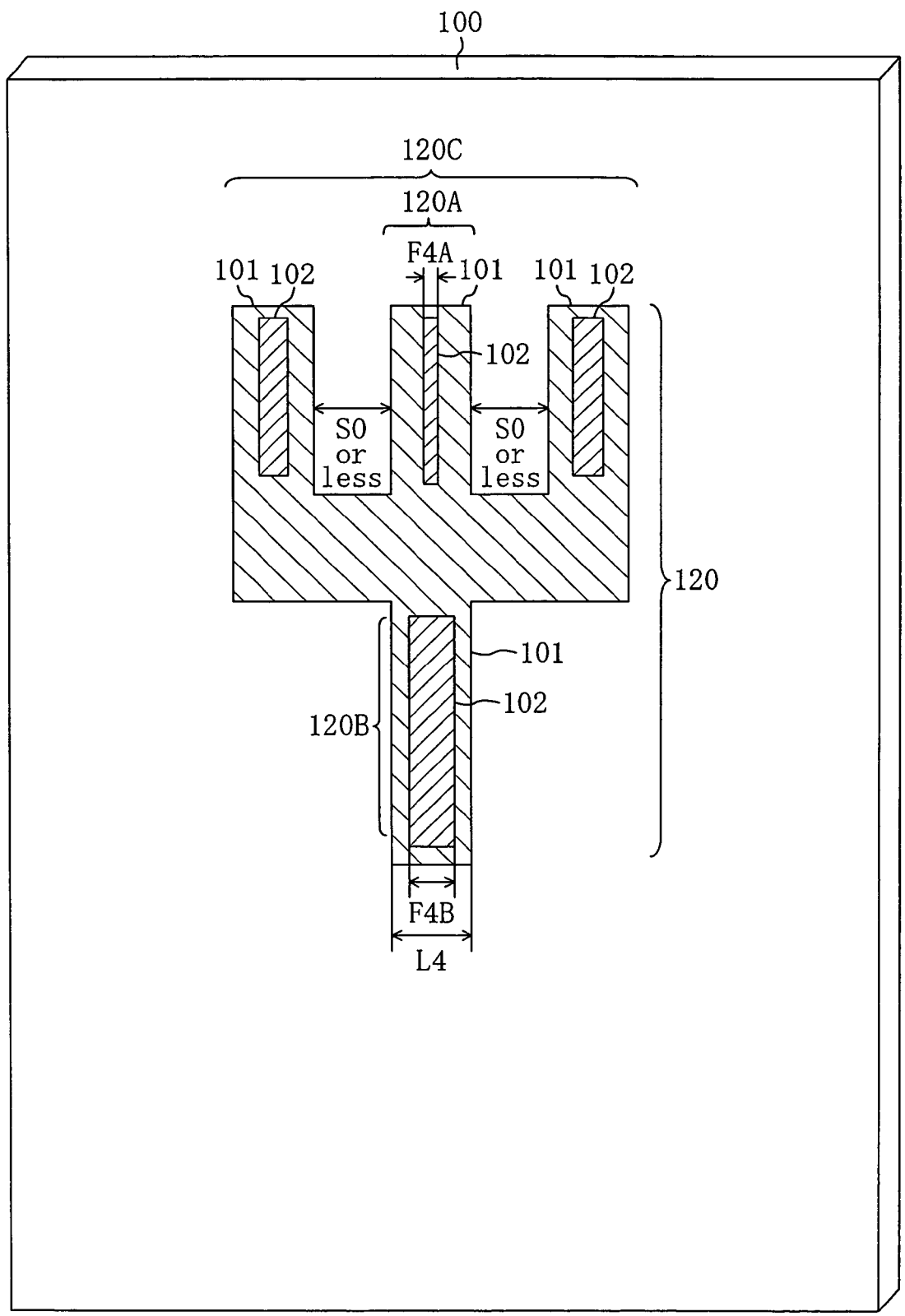
FIG. 4 is a plan view of another photomask according to Embodiment 1 of the invention.

In the above description of the densely arranged patterns, another pattern close to a target line-shaped pattern is a different pattern separated from the target line-shaped pattern. However, the densely arranged patterns are not necessarily composed of different patterns separated from one another. Specifically, if, for example, a plurality of line-shaped rectangular regions belonging to one pattern are arranged with a transparent portion sandwiched among them, the plural line-shaped rectangular regions alone may be specifically dealt with to be designated as line-shaped densely arranged patterns. FIG. 4 shows an example of a pattern including such plural line-shaped rectangular regions. In FIG. 4, like reference numerals are used to refer to like elements of the photomask of FIG. 3A so as to omit the description. As shown in FIG. 4, in a pattern 120 including a plurality of line-shaped rectangular regions, the plural line-shaped rectangular regions close to one another with a transparent portion having a width not larger than the given distance S0 sandwiched therebetween together form densely arranged patterns 120C. Specifically, the width F4A of a phase shifter 102 provided in a partial pattern 120A, that is, a rectangular region disposed at the center of the plural rectangular regions included in the densely arranged patterns 120C, is smaller than the width F4B of a phase shifter 102 provided in a partial pattern 120B, that is, an isolated rectangular region. Also, the width of a phase shifter 102 provided in each rectangular region disposed on a side of the partial pattern 120A is larger than the width F4A and not larger than the width F4B. Furthermore, the transparent portion (sandwiched between the plural line-shaped rectangular regions) may be a transparent portion surrounded with the shielding portion 101 such as the transparent portion of the frame-like pattern 113 shown in FIG. 2.

Furthermore, as shown in FIG. 3B, the shielding portion 101 is made of a shielding film and the phase shifter 102 can be formed by trenching a portion of the transparent substrate 100 in the opening of the shielding film.

According to Embodiment 1, in the mask enhancer structure of the partial pattern 121A close to the other patterns 122 and 123 at a distance not larger than the given distance, the width of the phase shifter 102 (the phase shifter 102A) is made relatively small. Therefore, in accordance with the degree at which light (in an identical phase with respect to the transparent portion) rounding to the back side of the partial pattern 121A through the transparent portion disposed around the partial pattern 121A is reduced owing to the close patterns 122 and 123, light (in an opposite phase with respect to the transparent portion) passing through the inside of the partial pattern 121A (the phase shifter 102A) can be reduced. Accordingly, the shielding property of the partial pattern 121A can be sufficiently improved, and hence, an exposure margin is increased and contrast in a light intensity distribution formed in the exposure is improved. In other words, also in a photomask including not only an isolated pattern but also complicated patterns close to each other, the effect to increase the process margin can be sufficiently attained by employing the mask enhancer structure. Also, since the width of the phase shifter included in the mask enhancer structure can be optimized in accordance with the close relationship between the patterns, a photomask capable of fine pattern formation with random pattern layout can be realized.

Furthermore, according to Embodiment 1, with respect to a pattern having the mask enhancer structure and included in the densely arranged patterns composed of a plurality of patterns arranged at arbitrary distances, a photomask capable of maximizing an exposure margin can be realized. Accordingly, good pattern formation characteristics attained by the mask enhancer structure of a fine mask pattern can be exhibited even when respective mask patterns are in an arbitrary close relationship, and hence, a photomask capable of fine pattern formation can be realized.

In this embodiment, the patterns 122 and 123 close to the pattern 121 having the mask enhancer structure are also shown as patterns having the mask enhancer structure in FIG. 3A. However, the patterns 122 and 123 forming the densely arranged patterns 151 together with the partial pattern 121A are not limited to the patterns having the mask enhancer structure but may be patterns made of a shielding portion alone.

Figure 5:
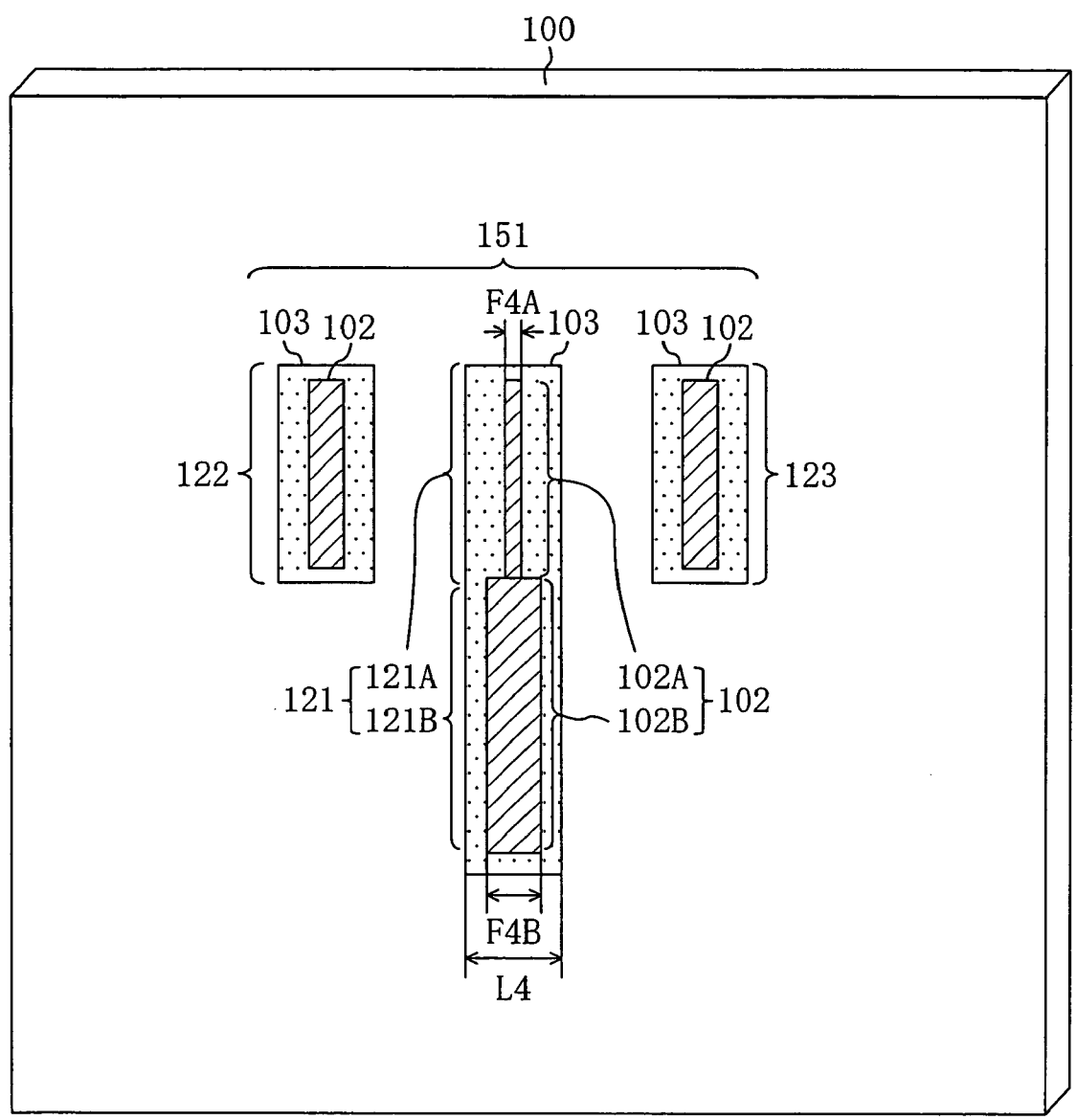
FIG. 5 is a plan view of a photomask according to Embodiment 1 in which a semi-shielding portion is used in the mask enhancer structure.

Furthermore, although the mask enhancer structure is described as a structure composed of a shielding portion and a phase shifter in this embodiment, the shielding portion may be replaced with a semi-shielding portion. Specifically, as shown in FIG. 5, the mask enhancer structure of each of the patterns 121 through 123 may be composed of a phase shifter 102 and a semi-shielding portion 103. As is obvious in FIG. 5, the shielding portion 101 of FIG. 3A is replaced with the semi-shielding portion 103.

Moreover, the partial patterns 121A and 121B included in the pattern 121 both have the line width L4 in this embodiment. However, the line widths of the partial patterns 121A and 121B may be different as far as they are larger than the given dimension W3 and not larger than the given dimension W2. Specifically, when the partial pattern 121A has a line width L4A and the partial pattern 121B has a line width L4B, there may be a relationship of L4A≠L4B as far as W2≧L4A>W3 and W2≧L4B>W3. Also, the given dimensions W2 and W3 preferably satisfy a relationship of $(W2-W3) \leq 0.2 \times \lambda/NA$. In other words, a difference between the line width L4A of the partial pattern 121A and the line width L4B of the partial pattern 121B is preferably not larger than $(0.2 \times \lambda/NA) \times M$.

Furthermore, in this embodiment, the partial pattern 121A included in the densely arranged patterns 151 and the partial pattern 121B isolated (along the direction vertical to the line direction) are both included in one continuous pattern, i.e., the pattern 121. However, as far as the aforementioned relationships among the line widths are satisfied, a pattern included in densely arranged patterns and an isolated pattern may be different patterns formed on one transparent substrate.

In this embodiment, the given dimension W0 is preferably not larger than 0.8×λ/NA and more preferably not smaller than 0.3×λ/NA and not larger than 0.6×λ/NA.

In this embodiment, the given distance S0 is preferably not larger than λ/NA.

Now, it is described in detail based on simulation results that the photomask of this embodiment exhibits good fine pattern formation characteristics not only in an isolated pattern region but also in a densely arranged pattern region owing to the mask enhancer structure.

First, an allowable range of the line width of a mask pattern for attaining sufficient contrast when the width of a phase shifter of the mask enhancer structure is the same will be described. Specifically, a difference between the given dimension W2 and the given dimension W3 (W2−W3) of this embodiment is preferably not larger than 0.2×λ/NA. This will now be described with reference to the accompanying drawings.

Figure 6:
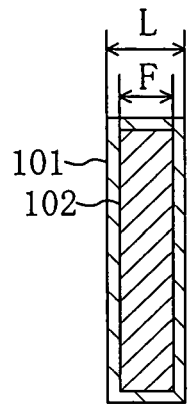
FIG. 6A is a diagram of an exemplified pattern having the mask enhancer structure of the invention and FIG. 6B is a contour graph obtained by plotting results of simulation for exposure margins obtained with various combinations of a pattern width L and a phase shifter width F of the pattern of FIG. 6A.
Figure 6:
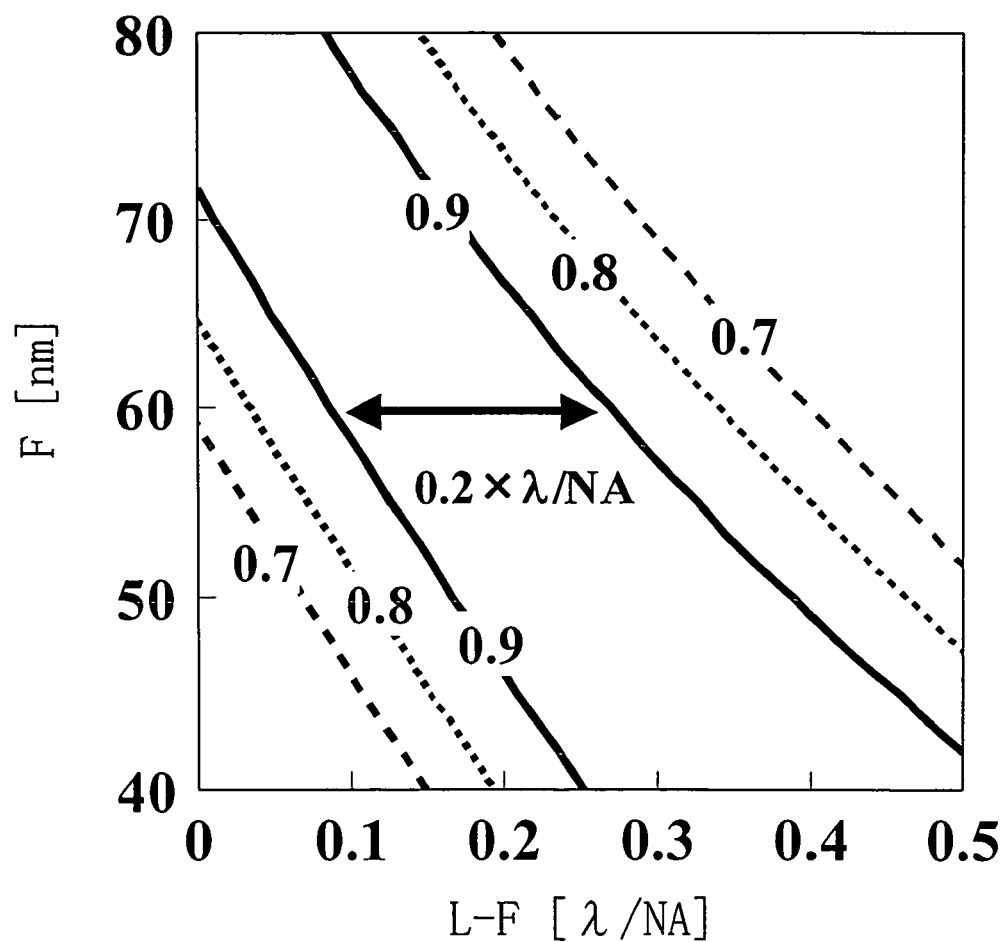

FIG. 6A is a diagram of an example of a pattern having the mask enhancer structure. The pattern of FIG. 6A is a line pattern with a pattern width L in which a phase shifter 102 with a line width F is surrounded with a shielding portion 101. The present inventor performed optical simulation for formation of a line pattern (a resist pattern) with a width of 70 nm by using the mask pattern of FIG. 6A with the combination of the width L and the width F variously varied. In the simulation, the exposure wavelength λ was set to 193 nm and the numerical aperture NA was set to 0.75, and ¾ annular illumination having the outer diameter with a degree of interference of 0.8 and the inner diameter with a degree of interference of 0.6 was used.

FIG. 6B is a contour graph obtained by plotting exposure margins against various combinations of the widths L and F in the pattern of FIG. 6A obtained through the simulation. The contour graph of FIG. 6B shows a ratio of an exposure margin E(L,F) attained in each combination of the widths L and F to the maximum exposure margin Emax attained in a combination of the widths L and F. Specifically, it shows a contour graph of E(L,F)/Emax. In this graph, the ordinate indicates the width F and the abscissa indicates a value obtained by normalizing (L−F) by λ/NA. It is noted that the exposure margin means a ratio (in %) of exposure energy change necessary for changing a pattern dimension by 10%. Specifically, as the exposure margin is larger, the pattern dimension is more stabilized against the exposure energy change, and hence it is possible to attain a preferable state that the pattern dimension is minimally changed against the exposure energy change in actual pattern formation.

It is understood from the contour graph of FIG. 6B that in the case where the width F is, for example, 60 nm, an exposure margin corresponding to 90% or more of the maximum exposure margin is realized when (L−F) falls in a range from 0.1×λ/NA to 0.3×λ/NA. In other words, when the range where an exposure margin corresponding to 90% or more of the maximum exposure margin is realized is regarded as the range for attaining a sufficient exposure margin, the allowable range of the pattern width L for obtaining the sufficient exposure margin by using the phase shifter with the width F of 60 nm is from F+0.1×λ/NA to F+0.3×λ/NA.

It is also understood from the graph of FIG. 6B that the pattern width L for attaining the sufficient exposure margin has a range of approximately 0.2×λ/NA when the width F has any value ranging from 40 to 80 nm. In other words, even when phase shifters having the same line width F are provided in respective patterns with line widths L different by 0.2×λ/NA or less, the sufficient exposure margin can be attained.

Next, the merit attained by setting the width of a phase shifter provided in the vicinity of the center of a pattern having the mask enhancer structure and included in densely arranged patterns to be smaller than the width of a phase shifter provided in the vicinity of the center of an isolated pattern having the mask enhancer structure will be described with reference to the accompanying drawings.

Figure 7:
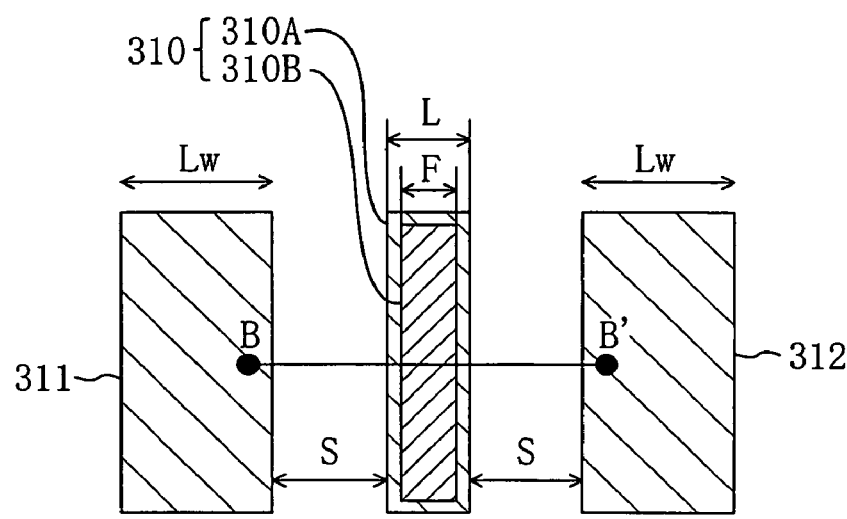
FIG. 7A is a diagram of an exemplified pattern having the mask enhancer structure of the invention and included in densely arranged patterns and FIG. 7B is a diagram of a light intensity distribution formed in exposure on a wafer in a position corresponding to a line BB' of FIG. 7A.
Figure 7:
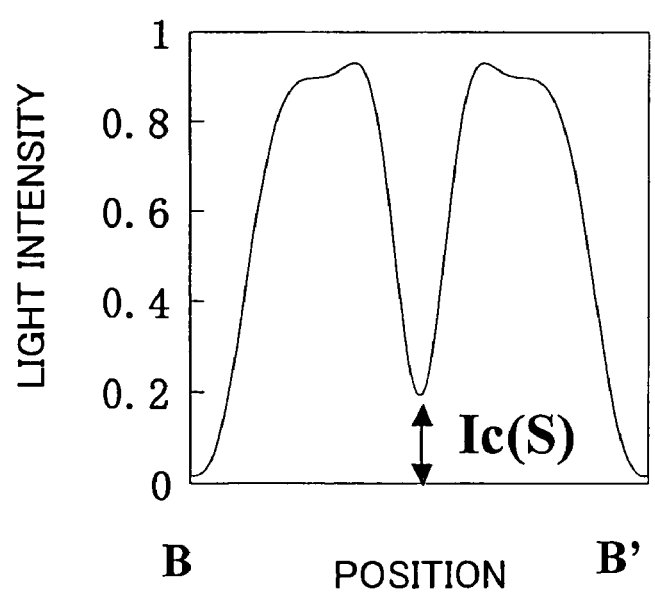

FIG. 7A is a diagram of a pattern having the mask enhancer structure and included in densely arranged patterns. As shown in FIG. 7A, line-shaped patterns 311 and 312 each made of a shielding portion and having a line width Lw are disposed on both sides of and close to a line-shaped pattern 310 with a line width L having the mask enhancer structure at a distance S (corresponding to a transparent portion). The mask enhancer structure of the line-shaped pattern 310 is constructed by surrounding a phase shifter 310B with a line width F with a shielding portion 310A.

FIG. 7B is a diagram of a light intensity distribution formed in exposure on a wafer in a position corresponding to line BB' of FIG. 7A. In FIG. 7B, when the light intensity obtained at the center of the pattern 310 with a line width L is indicated by Ic (which is changed depending upon the distance S), a smaller value of the light intensity Lc means that the pattern 310 exhibits a higher shielding property. On the contrary, a large value of the light intensity Lc means that the pattern 310 cannot sufficiently shield light. It is noted that the light intensity is herein expressed as relative light intensity obtained by assuming the light intensity of the exposing light to be 1 unless otherwise mentioned.

Figure 8:
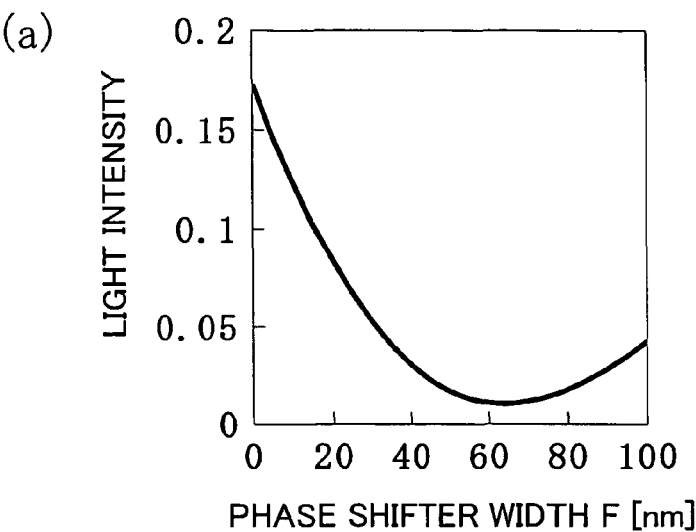
FIGS. 8A and 8B are diagrams for showing results of simulation for dependency of light intensity Ic of FIG. 7B on the phase shifter width F.
Figure 8:
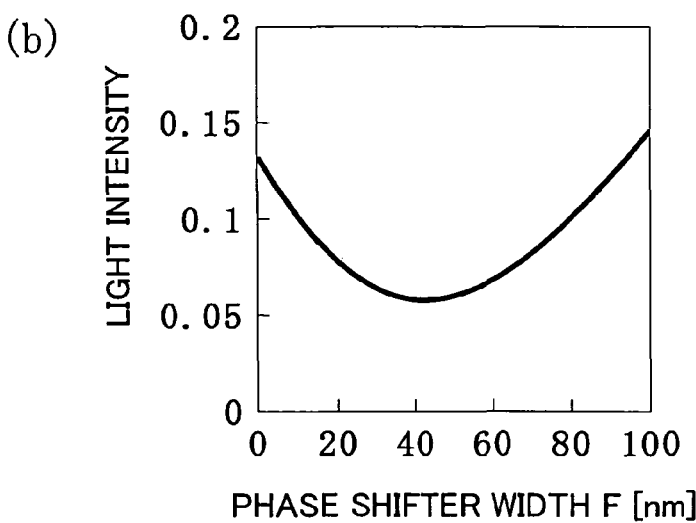

FIGS. 8A and 8B show results of simulation for dependency of the light intensity Ic on the width F of the phase shifter. In the simulation, the exposure wavelength λ was set to 193 nm and the numerical aperture NA was set to 0.75, and ¾ annular illumination having the outer diameter with a degree of interference of 0.8 and the inner diameter with a degree of interference of 0.6 was used. Also, the width L was set to 100 nm and the width Lw was set to 300 nm in the simulation. In other words, the pattern 310 having the width L of 100 nm that cannot sufficiently shield light by using a simple shielding pattern (because the width L of 100 nm is smaller than 0.8×λ/NA ≈206 nm) has the mask enhancer structure, and the patterns 311 and 312 each having the width Lw of 300 nm that can sufficiently shield light by using a simple shielding pattern are made of a shielding portion alone.

FIG. 8A is a graph of the results of the simulation for the dependency of the light intensity Ic on the width F of the phase shifter obtained in the case where the distance S is substantially infinite, namely, in the case where the pattern 310 having the mask enhancer structure is isolatedly present. Also, FIG. 8B is a graph of the results of the simulation for the dependency of the light intensity Ic on the width F of the phase shifter obtained in the case where the distance S is 100 nm, namely, in the case where other patterns (the patterns 311 and 312) are present in the vicinity of the pattern 310 having the mask enhancer structure.

In the graph of FIG. 8A, the light intensity Ic has the minimum value when the width F is 65 nm. In other words, it is understood that the maximum shielding property is attained when the width F of the phase shifter is 65 nm in the isolated pattern having the mask enhancer structure. On the other hand, in the graph of FIG. 8B, the light intensity Ic has the minimum value when the width F is 40 nm. In other words, it is understood that the maximum shielding property is attained when the width F is 40 nm in the pattern having the mask enhancer structure and close to other shielding patterns.

In this manner, even when the patterns having the mask enhancer structure have the same line width (L=100 nm), the width of the phase shifter for attaining the maximum shielding property, namely, the width of the phase shifter for attaining the maximum exposure margin, is different depending upon whether the pattern is isolated or included in densely arranged patterns. Specifically, the width of the phase shifter of 40 nm for attaining the maximum exposure margin in the pattern included in the densely arranged patterns is smaller than the width of the phase shifter of 65 nm for attaining the maximum exposure margin in the isolated pattern. This is for the following reason:

In the mask enhancer structure, the diffracted light rounding the periphery of the pattern to the back side of the pattern is cancelled by light in an opposite phase passing through the inside of the pattern, so as to improve the shielding property. Therefore, as the light rounding the periphery of the pattern is increased, the light in the opposite phase passing through the inside of the pattern is preferably increased. However, when the light rounding the periphery of the pattern is reduced, the light in the opposite phase passing through the inside of the pattern is preferably reduced. This is because if the light in the opposite phase passing through the inside of the mask pattern is excessive, the shielding property of the mask pattern is degraded, resulting in an undesirable condition for the pattern formation.

In the case where a fine shielding pattern is isolatedly present, not only the line width of the pattern is small but also a sufficiently large transparent region is present around the pattern. Therefore, a larger quantity of diffracted light rounds to the back side of the pattern. Accordingly, in order to sufficiently cancel such diffracted light, the mask enhancer structure preferably includes a phase shifter with a large width.

On the other hand, even in a similar fine shielding pattern, when it is close to another shielding pattern, by which the area of a transparent region around the pattern is reduced, the quantity of diffracted light rounding to the back side of the pattern is reduced as compared with that in the isolated pattern. Accordingly, in such a case, the mask enhancer structure preferably includes a phase shifter with a smaller width than in the isolated pattern.

In general, there is a correlation between the shielding property and the exposure margin, the contrast or the like, and therefore, in patterns having the mask enhancer structure and the same line width, a thin phase shifter is preferably provided when the pattern is included in densely arranged patterns together with other patterns and a thick phase shifter is preferably provided when the pattern is isolated. Thus, high pattern formation characteristics can be attained. Now, results of simulation performed for directly confirming this effect will be described. In this case, the pattern formation characteristics are evaluated on the basis of the exposure margin.

First, the present inventor obtained, through the simulation, the exposure margin obtained in forming a pattern with a width of 70 nm by using the mask pattern of FIG. 7A. In the simulation, the exposure wavelength $\lambda$ was set to 193 nm and the numerical aperture NA was set to 0.75, and ¾ annular illumination having the outer diameter with a degree of interference of 0.8 and the inner diameter with a degree of interference of 0.6 was used. Also, the width L of the pattern 310 of FIG. 7A was set to 100 nm and the width Lw of the shielding patterns 311 and 312 close to the pattern 310 was set to 300 nm.

Figure 9:
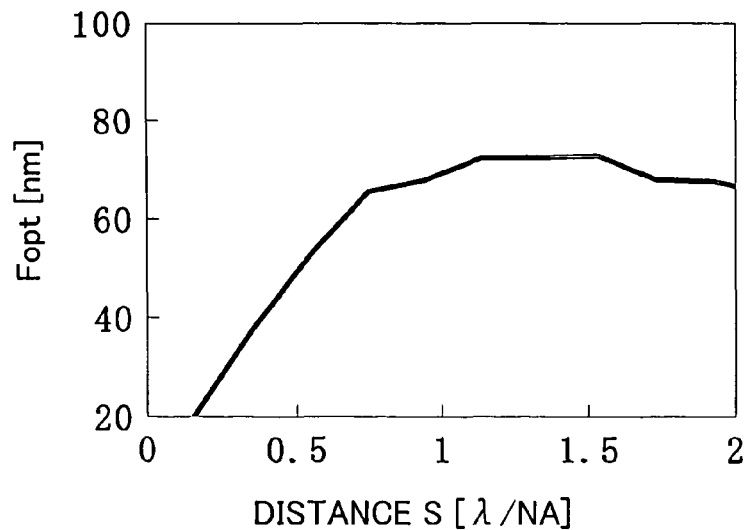
FIG. 9 is a graph obtained by plotting phase shifter widths Fopt for attaining a maximum exposure margin with a close distance S between patterns changed on the basis of results of simulation for the exposure margin in formation of a pattern with a width of 70 nm by using the mask pattern of FIG. 7A.

FIG. 9 is a graph obtained by plotting the widths Fopt of the phase shifter for attaining the maximum exposure margin with the distance S between the patterns changed in the aforementioned conditions. In FIG. 9, the distance S is indicated as a value normalized by $\lambda/NA$.

As is understood from FIG. 9, when the distance S is not larger than $\lambda/NA$ (namely, when the normalized distance S is not larger than 1), the width Fopt of the phase shifter for attaining the maximum exposure margin is reduced. In particular, when the distance S is not larger than $0.5\times\lambda/NA$, the optimal width Fopt of the phase shifter is reduced to be approximately a half of that obtained when the distance S exceeds $\lambda/NA$ (namely, when the pattern 310 is substantially isolated). Accordingly, it is understood that in order to realize a satisfactory exposure margin, the phase shifter provided at the center of the pattern having the mask enhancer structure and included in the densely arranged patterns composed of patterns arranged at the distance S not larger than $\lambda/NA$ preferably has a smaller width than a phase shifter provided in an isolated pattern. Furthermore, the essence of this preferable architecture is that the ratio of the width of a phase shifter to the line width of a mask pattern included in densely arranged patterns is relatively reduced.

Even when the widths of desired patterns formed on a wafer are the same, the width of a mask pattern may be changed in accordance with a distance to another close pattern due to a phenomenon generally designated as a proximity effect. In this manner, in the case where the line widths of mask patterns are different between a densely arranged pattern region and an isolated pattern region even through the widths of desired patterns formed on a wafer are the same, the ratio of the width of the phase shifter to the width of the mask pattern is appropriately relatively reduced in the densely arranged pattern region.

Specifically, a ratio Fd/Ld between the line width Ld of a pattern having the mask enhancer structure and disposed in a densely arranged pattern region and the width Fd of a phase shifter provided in the vicinity of the center of this pattern is preferably smaller than a ratio Fi/Li between the line width Li of a pattern having the mask enhancer structure and disposed in an isolated pattern region and the width Fi of a phase shifter provided in the vicinity of this pattern.

Furthermore, when the graph of FIG. 9 is observed in detail, it is understood that in the case where the distance S is not larger than $\lambda/NA$, the width Fopt of the phase shifter for attaining the maximum exposure margin is also reduced in proportion to the degree of reduction of the distance S. A preferable architecture of a pattern having the mask enhancer structure and included in densely arranged patterns obtained on the basis of this result will be described in detail in Modification 1 below.

In calculation of the width Fopt of the phase shifter for attaining the maximum exposure margin shown in FIG. 9, the width Fopt was calculated by assuming that the other patterns (the patterns 311 and 312 of FIG. 7A) close to the pattern having the mask enhancer structure (the pattern 310 of FIG. 7A) are simple shielding patterns made of a shielding portion alone, and the calculation results of the widths Fopt obtained by assuming that the other close patterns have the mask enhancer structure will now be described.

Figure 10:
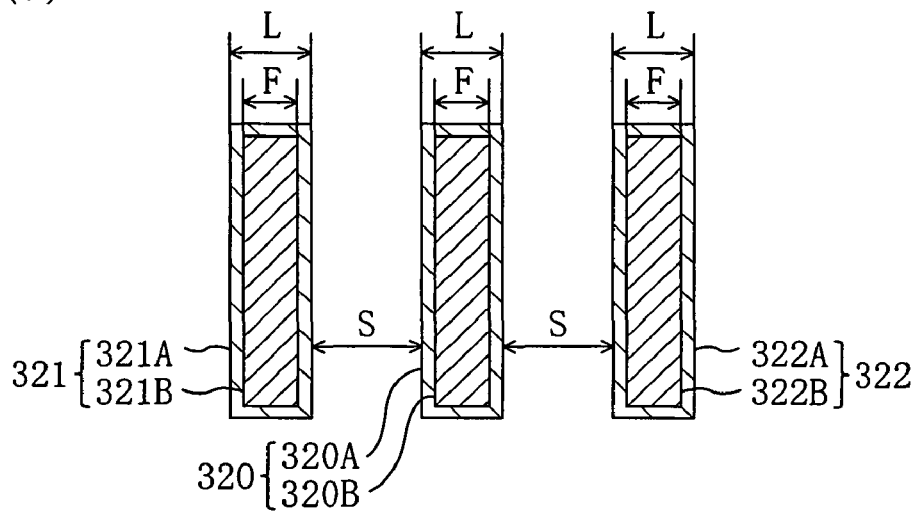
FIG. 10A is a diagram of an exemplified pattern having the mask enhancer structure of the invention and included in densely arranged patterns together with another pattern having the mask enhancer structure and FIG. 10B is a graph obtained by plotting phase shifter widths Fopt for attaining a maximum exposure margin with a close distance S between patterns changed on the basis of results of simulation for the exposure margin in formation of a pattern with a width of 70 nm by using the mask pattern of FIG. 10A.
Figure 10:
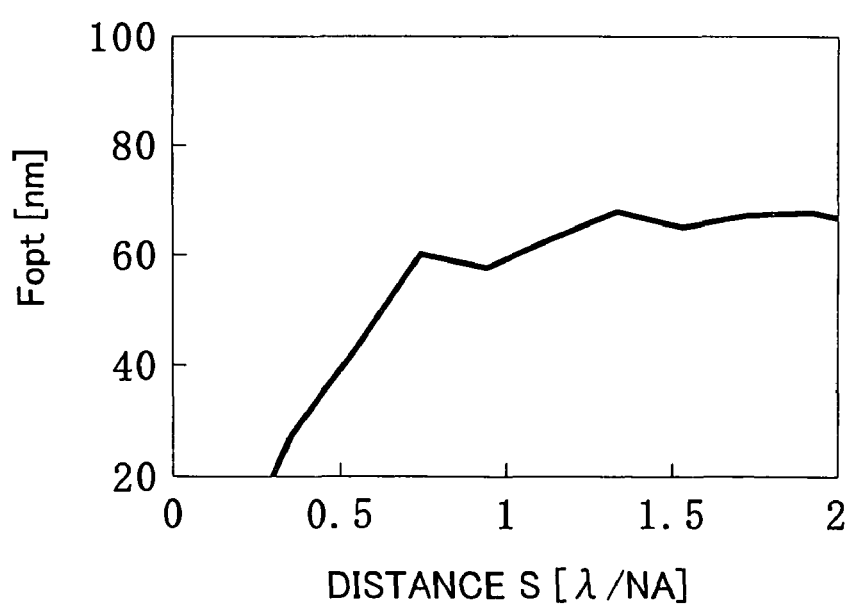

FIG. 10A is a diagram of densely arranged patterns formed by a pattern having the mask enhancer structure together with other patterns having the mask enhancer structure. As shown in FIG. 10A, line-shaped patterns 321 and 322 with a line width L having the mask enhancer structure are disposed on both sides of and close to a line-shaped pattern 320 with a line width L having the mask enhancer structure at a distance S (corresponding to a transparent region). The mask enhancer structure of each of the patterns 320 through 322 is constructed by surrounding each of phase shifters 320B through 322B with a line width F with each of shielding portions 320A through 322A.

The present inventor obtained, through the simulation, the exposure margin obtained in forming a pattern with a width of 70 nm by using the mask pattern of FIG. 10A. In the simulation, the exposure wavelength λ was set to 193 nm and the numerical aperture NA was set to 0.75, and ¾ annular illumination having the outer diameter with a degree of interference of 0.8 and the inner diameter with a degree of interference of 0.6 was used. Also, the width L of the patterns 320 through 322 of FIG. 10A was set to 100 nm.

FIG. 10B is a graph obtained by plotting the widths Fopt of the phase shifter for attaining the maximum exposure margin with the distance S between the patterns changed in the aforementioned conditions. In FIG. 10B, the distance S is indicated as a value normalized by λ/NA.

As is understood from FIG. 10B, substantially the same results as those of FIG. 9 are obtained in using the mask pattern shown in FIG. 10A. Specifically, when the distance S is not larger than λ/NA, the width Fopt of the phase shifter for attaining the maximum exposure margin is reduced. However, a small difference of the graph of FIG. 10B from the graph of FIG. 9 is that the width Fopt of the phase shifter for attaining the maximum exposure margin is smaller by approximately 5 nm when the distance S is the same. This difference is caused because the light in the opposite phase is excessive as a whole due to the influence of the light in the opposite phase passing through the phase shifters 321B and 322B of the other close patterns 321 and 322. Accordingly, in determining the width of a phase shifter of the mask enhancer structure, even in the case where patterns are close to one another at the same distance, it is preferably grasped whether another pattern close to a target pattern has the mask enhancer structure or is a simple shielding pattern (this preferable architecture will be described in detail in Modification 2 below).

Modification 1 of Embodiment 1

A photomask according to Modification 1 of Embodiment 1 of the invention will now be described with reference to the accompanying drawings.

Figure 11:
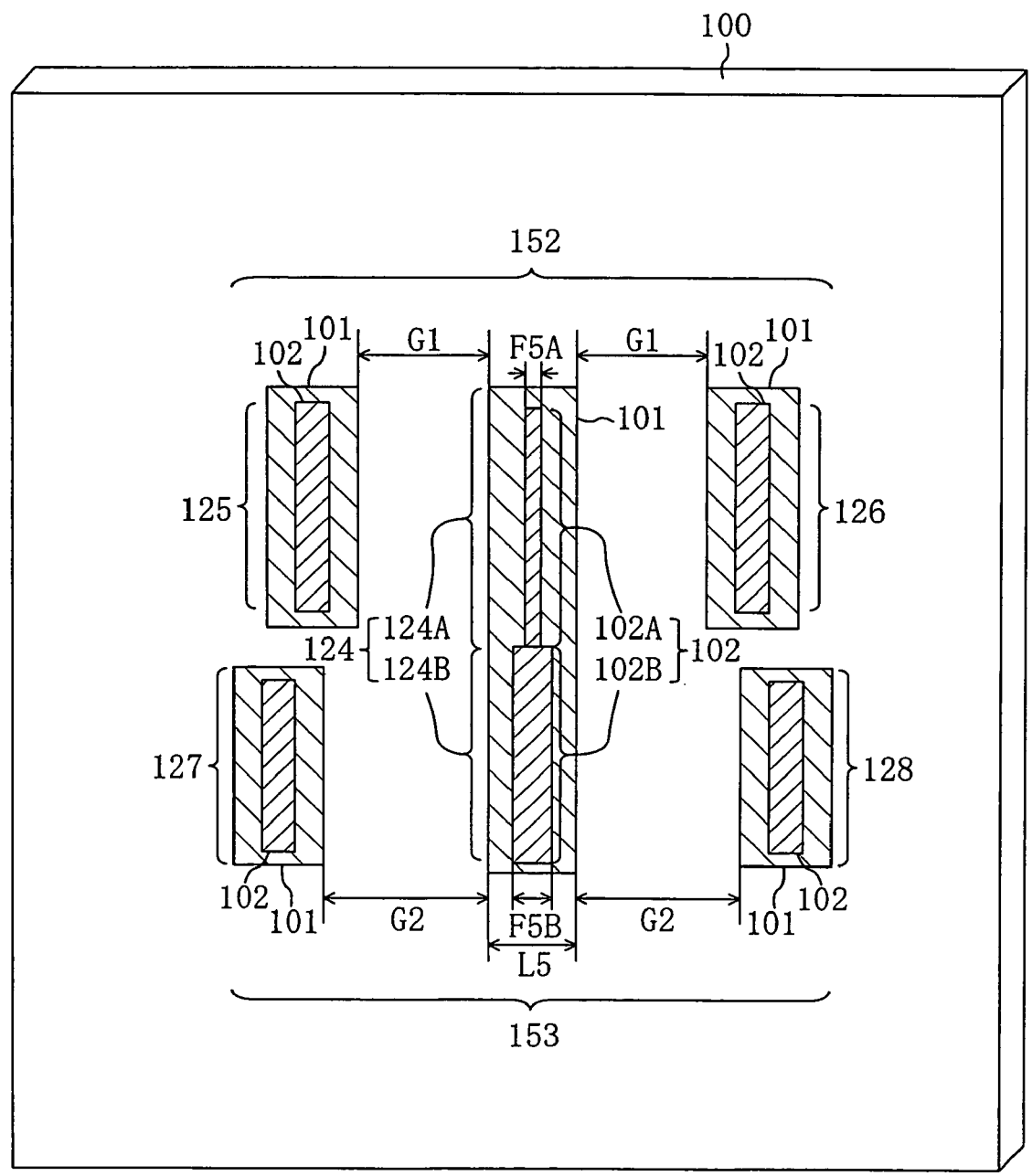
FIG. 11 is a plan view of a photomask according to Modification 1 of Embodiment 1 of the invention.

FIG. 11 is a plan view of the photomask of Modification 1 of Embodiment 1, and more specifically, a photomask provided with a mask pattern having the mask enhancer structure and included in densely arranged patterns. In FIG. 11, a transparent substrate 100 is perspectively shown.

As shown in FIG. 11, mask patterns (line patterns 124 through 128) for forming desired line-shaped patterns on a wafer through exposure are drawn on the transparent substrate 100. In this case, each of the line patterns 124 through 128 is basically made of a shielding portion 101. Furthermore, a phase shifter 102 is provided at the center of a pattern region of each of the line patterns 124 through 128 having a line width not larger than a given dimension W0. Specifically, each of the line patterns 124 through 128 has the mask enhancer structure. For example, the pattern 124 is a pattern with a line width L5 satisfying a relationship of W2≧L5>W3 with respect to given dimensions W2 and W3 satisfying a relationship of W0≧W2>W3, and the phase shifter 102 is provided at the center of the pattern 124.

Also, as shown in FIG. 11, the pattern 124 includes a partial pattern 124A close to different patterns 125 and 126 at a distance G1 (S0>G1) with a transparent portion sandwiched therebetween along a direction vertical to the line direction thereof. The partial pattern 124A forms densely arranged patterns 152 together with the different patterns 125 and 126 sandwiching the partial pattern 124A. Also, a phase shifter 102A with a line width F5A is provided at the center of the partial pattern 124A.

Furthermore, the pattern 124 includes a partial pattern 124B close to different patterns 127 and 128 at a distance G2 (S0>G2>G1) with the transparent portion sandwiched therebetween along the vertical direction. The partial pattern 124B forms densely arranged patterns 153 together with the different patterns 127 and 128 sandwiching the partial pattern 124B. Also, a phase shifter 102B with a line width F5B is provided at the center of the partial pattern 124B.

This modification is characterized by the architecture in which F5B>F5A. Specifically, in patterns having the mask enhancer structure and included in densely arranged patterns, the width of a phase shifter provided at the center of a pattern included in densely arranged patterns with a high close degree is smaller than the width of a phase shifter provided at the center of a pattern included in densely arranged patterns with a low close degree.

Furthermore, the width of a phase shifter of the mask enhancer structure is preferably smaller in proportion to the close degree of densely arranged patterns including the phase shifter. Specifically, in the mask architecture shown in FIG. 11, a value (F5B−F5A) is preferably in proportion to a value (G2−G1).

In the above description, the respective line-shaped patterns are different patterns separated from one another. Also in this modification, however, in the case where a plurality of line-shaped rectangular regions belonging to a complicated polygonal pattern are regarded as a target, the aforementioned relationships may be satisfied in the respective line-shaped rectangular regions alone as in Embodiment 1. Also, the transparent portion between the line-shaped rectangular regions may be a transparent portion surrounded with the shielding portion 101 such as the transparent portion disposed within the frame-like pattern 113 shown in FIG. 2.

According to this modification, as the distance to another close pattern is smaller, the width of a phase shifter provided in a pattern having the mask enhancer structure (the pattern 124) is smaller. Therefore, in accordance with the degree at which light (in an identical phase with respect to the transparent portion) rounding through the transparent portion disposed around the pattern 124 to the back side of the pattern 124 is reduced owing to another close pattern, light (in an opposite phase with respect to the transparent portion) passing through the inside of the pattern 124 (the phase shifter 102) can be reduced. Accordingly, the shielding property of the pattern 124 can be sufficiently improved, and hence, the exposure margin is increased and the contrast in the light intensity distribution formed in the exposure is improved. In other words, also in a photomask including not only isolated patterns but also complicated patterns close to one another, the effect to increase the process margin can be sufficiently attained by employing the mask enhancer structure. Also, since the width of a phase shifter used in the mask enhancer structure can be optimized in accordance with the close relationship between patterns, a photomask capable of fine pattern formation with random pattern layout can be realized.

Moreover, according to this modification, with respect to a pattern having the mask enhancer structure and included in densely arranged patterns composed of a plurality of patterns arranged at arbitrary distances, a photomask capable of maximizing the exposure margin can be realized. Accordingly, the good pattern formation characteristics attained owing to the mask enhancer structure employed in fine mask patterns can be exhibited also when respective patterns used as the mask patterns have an arbitrary close relationship, and therefore, a photomask capable of fine pattern formation can be realized.

In this modification, the patterns 125 through 128 close to the pattern 124 having the mask enhancer structure are shown in FIG. 11 also as patterns having the mask enhancer structure. However, the patterns 125 through 128 are not limited to the patterns having the mask enhancer structure but may be patterns made of a shielding portion alone.

Figure 12:
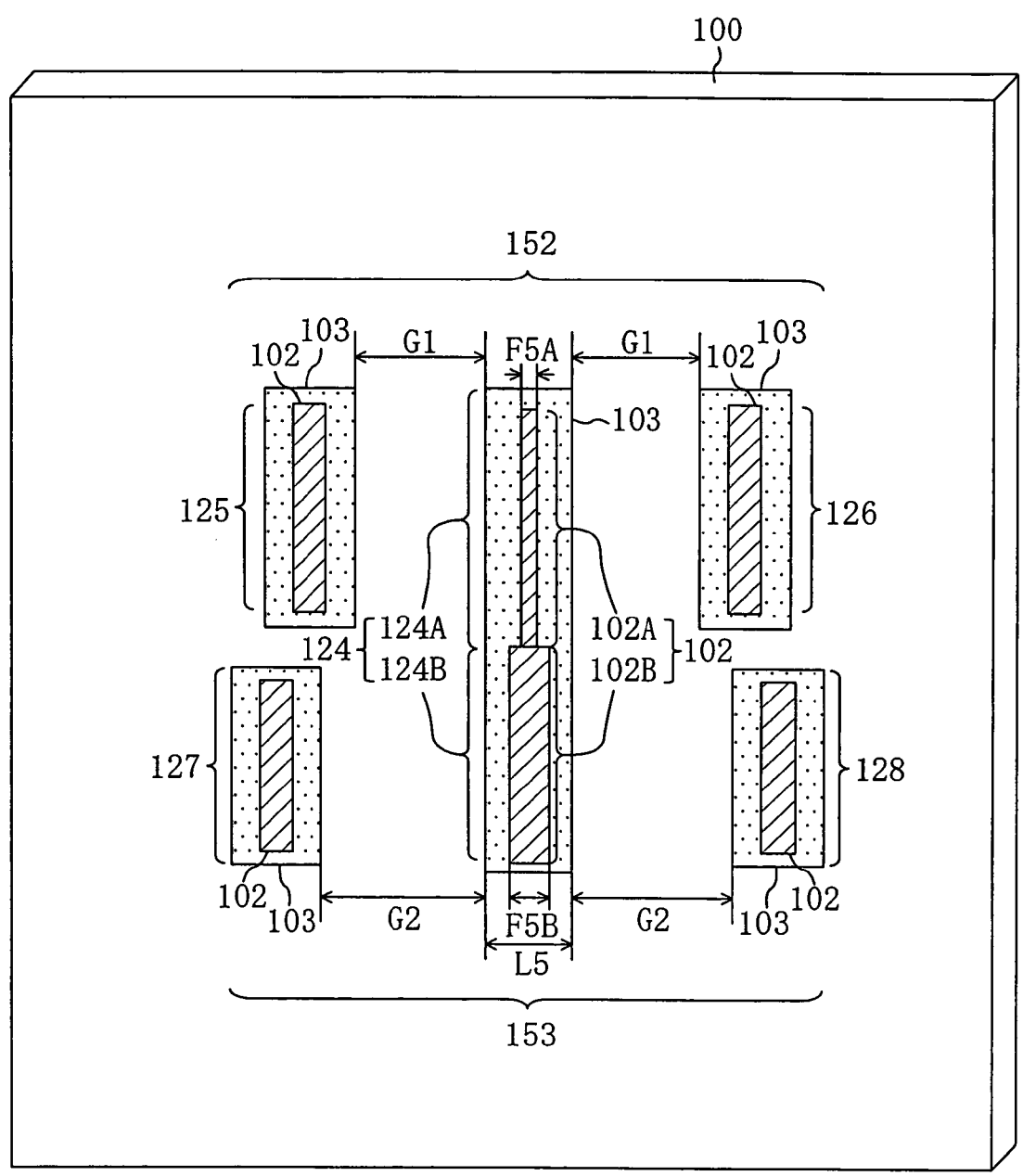
FIG. 12 is a plan view of a photomask according to Modification 1 of Embodiment 1 of the invention in which a semi-shielding portion is used in the mask enhancer structure.

Furthermore, although the mask enhancer structure is described to be composed of a shielding portion and a phase shifter in this modification, the shielding portion may be replaced with a semi-shielding portion. Specifically, the mask enhancer structure of each of the patterns 124 through 128 may be composed of a phase shifter 102 and a semi-shielding portion 103 as shown in FIG. 12. As is obvious from FIG. 12, the shielding portion 101 of FIG. 11 is replaced with a semi-shielding portion 103.

Moreover, in this modification, both of the partial pattern 124A and the partial pattern 124B included in the pattern 124 have the line width L5. However, the line widths of the partial patterns 124A and 124B may be different as far as they are larger than the dimension W3 and not larger than the dimension W2. Specifically, assuming that the partial pattern 124A has a line width L5A and the partial pattern 124B has a line width L5B, there may be a relationship of L5A≠L5B as far as W2≧L5A>W3 and W2≧L5B>W3. Also, the given dimensions W2 and W3 preferably satisfy a relationship of (W2−W3)≦0.2×λ/NA as in Embodiment 1. Specifically, a difference between the line width L5A of the partial pattern 124A and the line width L5B of the partial pattern 124B is preferably not larger than (0.2×λ/NA)×M. In this case, when the line widths of mask patterns are different between a densely arranged pattern region with a high close degree and a densely arranged pattern region with a low close degree although the widths of desired patterns to be formed on a wafer are the same, and specifically, when the line width L5A of the partial pattern 124A and the line width L5B of the partial pattern 124B are different, the following architecture is preferably employed: A ratio F5A/L5A between the line width L5A of the mask pattern disposed in the densely arranged pattern region with a high close degree and the width F5A of the phase shifter provided in the vicinity of the center of this pattern (the phase shifter 102A) is smaller than a ratio F5B/L5B between the line width L5B of the mask pattern disposed in the densely arranged pattern region with a low close degree and the width F5B of the phase shifter provided in the vicinity of the center of this pattern (the phase shifter 102B).

Furthermore, this modification is described by exemplifying the case where the partial pattern 124A included in the densely arranged patterns 152 with a high close degree and the partial pattern 124B included in the densely arranged patterns 152 with a low close degree are both included in one continuous pattern, i.e., the pattern 124. However, as far as the aforementioned relationships among the widths are satisfied, a pattern included in densely arranged patterns with a high close degree and a pattern included in densely arranged patterns with a low close degree may be different patterns disposed on one transparent substrate.

Moreover, the dimension W0 is preferably not larger than 0.8×λ/NA and more preferably not smaller than 0.3×λ/NA and not larger than 0.6×λ/NA also in this modification as in Embodiment 1.

In addition, the distance S0 is preferably not larger than λ/NA also in this modification as in Embodiment 1.

When it is assumed that G2>S0 and S0>G1 in the architecture of this modification, the width of a phase shifter provided in densely arranged patterns arranged at a distance not smaller than the distance S0 may be set to a value the same as that employed in an isolated pattern, and therefore, the mask architecture may be set so that the value (F5B−F5A) can be in proportion to a value (S0−G1).

Although this modification is described by exemplifying the case where the respective patterns are arranged at an equal distance in the densely arranged patterns, the architecture of this modification is applicable to densely arranged patterns composed of patterns arranged at irregular distances.

FIGS. 13A through 13D are diagrams for explaining a method for converting densely arranged patterns composed of patterns arranged at irregular distances into equivalent densely arranged patterns composed of patterns arranged at an equal distance.

Figure 13:
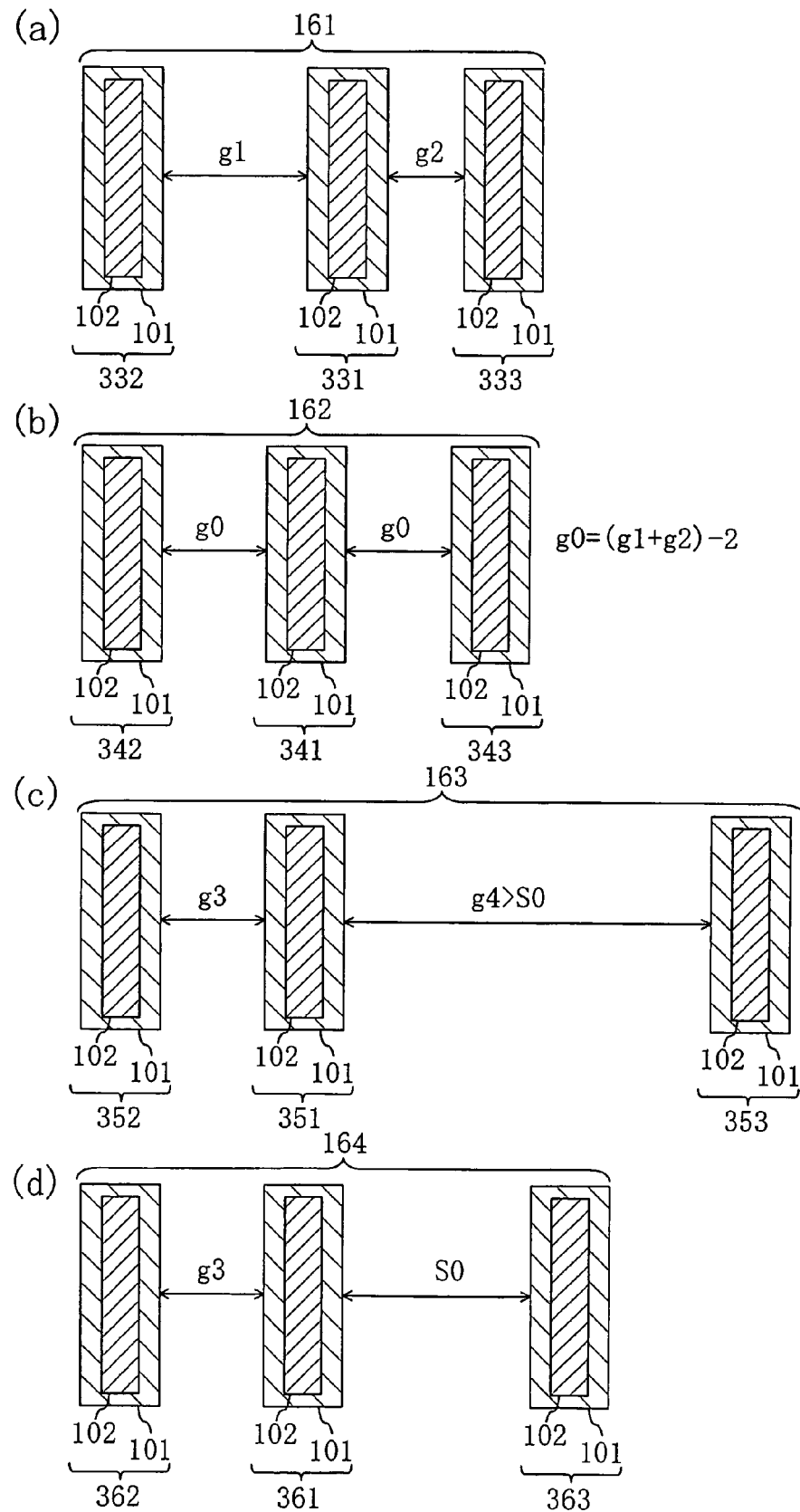
FIGS. 13A, 13B, 13C and 13D are diagrams for explaining a method for converting densely arranged patterns composed of patterns arranged at irregular distances into equivalent densely arranged patterns composed of patterns arranged at an equal distance in the photomask of Modification 1 of Embodiment 1.

First, in densely arranged patterns 161 of FIG. 13A, distances from a target pattern 331 to different patterns 332 and 333 disposed to be close on both sides of the target pattern 331 are assumed to be distances g1 and g2, respectively. In this case, when both the distances g1 and g2 are not larger than the distance S0, the densely arranged patterns 161 may be regarded as equivalent to densely arranged patterns 162 of FIG. 13B. Specifically, in the densely arranged patterns 162, distances from a target pattern 341 to different patterns 342 and 343 disposed to be close on both sides of the target pattern 341 are equal to be a distance g0=(g1+g2)/2. The densely arranged patterns 161 and the densely arranged patterns 162 may be regarded as equivalent for the following reason: The mask architecture of this modification is devised in consideration of the diffraction, and the law of arithmetic mean works out in a physical phenomenon depending upon a pitch of cyclic arrangement. It is noted that the respective patterns 331 through 333 included in the densely arranged patterns 161 and the respective patterns 341 through 343 included in the densely arranged patterns 162 all have the mask enhancer structure in which a phase shifter 102 is provided at the center of a line-shaped shielding portion 101.

In densely arranged patterns 163 of FIG. 13C, distances from a target pattern 351 to different patterns 352 and 353 disposed to be close on both sides of the target pattern 351 are assumed to be distances g3 and g4, respectively. In this case, if g4>S0 and S0>g3, the densely arranged patterns 163 may be regarded as equivalent to densely arranged patterns 164 of FIG. 13D. Specifically, in the densely arranged patterns 164, distances from a target pattern 361 to different patterns 362 and 363 disposed to be close on both sides of the target pattern 361 are distances g3 and S0, respectively. The densely arranged patterns 163 and the densely arranged patterns 164 may be regarded as equivalent for the following reason: In the case where a distance between patterns is larger than the distance S0, this case is optically equivalent to a case where a distance between patterns is the distance S0, and therefore, there is no need to directly consider a distance between patterns larger than the distance S0 in the calculation performed for determining the width of a phase shifter. Furthermore, the densely arranged patterns 164 of FIG. 13D may be converted into densely arranged patterns composed of patterns arranged at an equal distance (specifically, a distance of (g3+S0)/2) in the same manner as in the conversion of the densely arranged patterns 161 of FIG. 13A into the densely arranged patterns 162 of FIG. 13B. It is noted that the respective patterns 351 through 353 included in the densely arranged patterns 163 and the respective patterns 361 through 363 included in the densely arranged patterns 164 all have the mask enhancer structure in which a phase shifter 102 is provided at the center of a line-shaped shielding portion 101.

Modification 2 of Embodiment 1

A photomask according to Modification 2 of Embodiment 1 of the invention will now be described with reference to the accompanying drawings.

Figure 14:
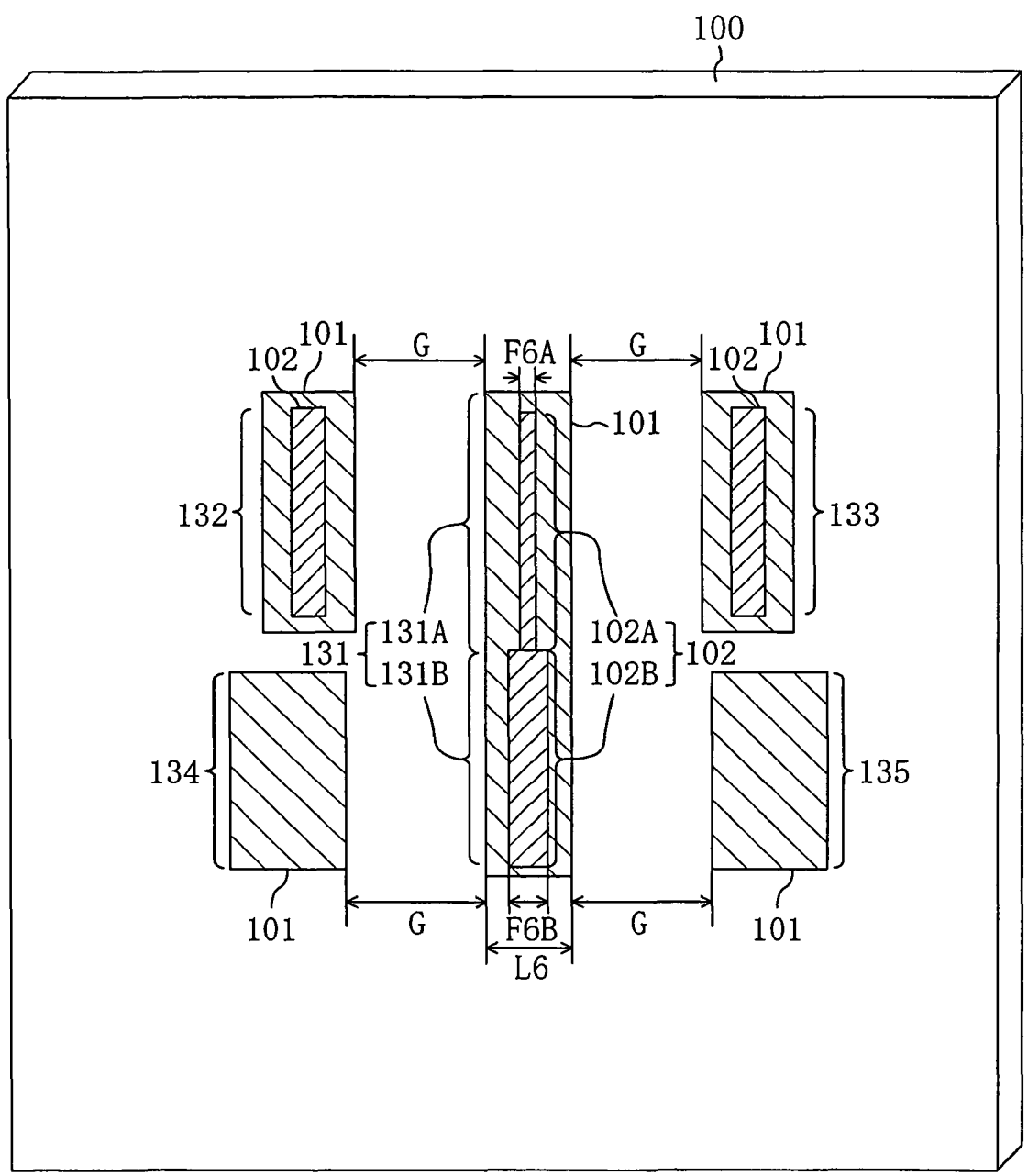
FIG. 14 is a plan view of a photomask according to Modification 2 of Embodiment 1 of the invention.

FIG. 14 is a plan view of the photomask of Modification 2 of Embodiment 1, and more specifically, a photomask provided with a mask pattern having the mask enhancer structure and included in densely arranged patterns. In FIG. 14, a transparent substrate 100 is perspectively shown.

As shown in FIG. 14, mask patterns (line patterns 131 through 135) for forming desired line-shaped patterns on a wafer through exposure are drawn on the transparent substrate 100. In this case, each of the line patterns 131 through 135 is basically made of a shielding portion 101. Furthermore, a phase shifter 102 is provided at the center of a pattern region, having a line width not larger than a given dimension W0, of each of the line patterns 131 through 133. Specifically, each of the line patterns 131 through 133 has the mask enhancer structure. For example, the pattern 131 is a pattern with a line width L6 satisfying a relationship of W2≧L6>W3 with respect to given dimensions W2 and W3 satisfying a relationship of W0≧W2>W3, and the phase shifter 102 is provided at the center of the pattern 131.

Also, as shown in FIG. 14, the pattern 131 includes a partial pattern (mask enhancer close portion) 131A close to different patterns 132 and 133 (having the mask enhancer structure) at a distance G (S0>G) with a transparent portion sandwiched therebetween along a direction vertical to the line direction thereof. Furthermore, a phase shifter 102A with a line width F6A is provided at the center of the partial pattern 131A.

Furthermore, the pattern 124 includes a partial pattern (shielding pattern close portion) 131B close to different patterns 134 and 135 (made of the shielding portion 101 alone) at the distance G (S0>G) with the transparent portion sandwiched therebetween along the vertical direction. In other words, the pattern 131 including the partial patterns 131A and 131B is close to the different patterns 132 through 135 at an equal distance. Also, a phase shifter 102B with a line width F6B is provided at the center of the partial pattern 131B.

This modification is characterized by the architecture in which F5B>F5A. Specifically, the width of a phase shifter provided in a pattern included in densely arranged patterns composed of patterns having the mask enhancer structure is smaller than the width of a phase shifter provided in a pattern included in densely arranged patterns composed of both a pattern having the mask enhancer structure and a simple shielding pattern.

In the above description, the respective line-shaped patterns are different patterns separated from one another. Also in this modification, however, in the case where a plurality of line-shaped rectangular regions belonging to a complicated polygonal pattern are regarded as a target, the aforementioned relationships may be satisfied in the respective line-shaped rectangular regions alone in the same manner as in Modification 1 of Embodiment 1. Also, the transparent portion between the line-shaped rectangular regions may be a transparent portion surrounded with the shielding portion 101 such as the transparent portion disposed within the frame-like pattern 113 shown in FIG. 2.

According to this modification, the width of a phase shifter provided in a pattern having the mask enhancer structure (the pattern 131) is smaller in the case where another close pattern has the mask enhancer structure than in the case where another close pattern is made of a shielding portion. In other words, as the shielding property of another pattern is higher, the width of a phase shifter provided in the pattern 131 is smaller. Therefore, in accordance with the degree at which light (in an identical phase with respect to the transparent portion) rounding to the back side of the pattern 131 through the transparent portion disposed around the pattern 131 is reduced owing to another pattern, light (in an opposite phase with respect to the transparent portion) passing through the inside of the pattern 131 (the phase shifter 102) can be reduced. Accordingly, the shielding property of the pattern 131 can be sufficiently improved, and hence, an exposure margin is increased and contrast in a light intensity distribution formed in the exposure is improved. In other words, also in a photomask including not only isolated patterns but also complicated patterns close to one another, the effect to increase the process margin can be sufficiently attained by employing the mask enhancer structure. Also, since the width of the phase shifter included in the mask enhancer structure can be optimized in accordance with the shielding property of another adjacent pattern, a photomask capable of fine pattern formation with random pattern layout can be realized.

Furthermore, according to this modification, with respect to a pattern having the mask enhancer structure and included in densely arranged patterns compose of a plurality of patterns arranged at arbitrary distances, a photomask capable of maximizing an exposure margin can be realized. Accordingly, good pattern formation characteristics attained by the mask enhancer structure of a fine mask pattern can be exhibited even when respective mask patterns are in an arbitrary close relationship, and hence, a photomask capable of fine pattern formation can be realized.

Although the mask enhancer structure is described to be composed of a shielding portion and a phase shifter in this modification, the shielding portion may be replaced with a semi-shielding portion.

Moreover, in this modification, both of the partial pattern 131A and the partial pattern 131B included in the pattern 131 have the line width L6. However, the line widths of the partial patterns 131A and 131B may be different as far as they are larger than the dimension W3 and not larger than the dimension W2. Specifically, assuming that the partial pattern 131A has a line width L6A and the partial pattern 131B has a line width L6B, there may be a relationship of L6A≠L6B as far as W2≧L6A>W3 and W2≧L6B>W3. Also, the given dimensions W2 and W3 preferably satisfy a relationship of (W2−W3)≦0.2×λ/NA as in Embodiment 1. Specifically, a difference between the line width L6A of the partial pattern 131A and the line width L6B of the partial pattern 131B is preferably not larger than (0.2×λ/NA)×M. In this case, when the line width L6A of the partial pattern 131A (the mask enhancer close pattern) is different from the line width L6B of the partial pattern 131B (the shielding portion close pattern) although the widths of desired patterns to be formed on a wafer are the same, the following architecture is preferably employed: A ratio F6A/L6A between the line width L6A of the partial pattern 131A corresponding to the mask enhancer close portion and the width F6A of the phase shifter provided in the vicinity of the center of this pattern (the phase shifter 102A) is smaller than a ratio F6B/L6B between the line width L6B of the partial pattern 131B corresponding to the shielding pattern close portion and the width F6B of the phase shifter provided in the vicinity of the center of this pattern (the phase shifter 102B).

Furthermore, this modification is described by exemplifying the case where the partial pattern 131A corresponding to the mask enhancer close portion and the partial pattern 131B corresponding to the shielding pattern close portion are both included in one continuous pattern, i.e., the pattern 131. However, as far as the aforementioned relationships among the widths are satisfied, a pattern corresponding to a mask enhancer close portion and a pattern corresponding to a shielding pattern close portion may be different patterns disposed on one transparent substrate.

Moreover, the dimension W0 is preferably not larger than 0.8×λ/NA and more preferably not smaller than 0.3×λ/NA and not larger than 0.6×λ/NA also in this modification as in Embodiment 1. The distance S0 is preferably not larger than λ/NA as in Embodiment 1.

In addition, the distance S0 is preferably not larger than λ/NA also in this modification as in Embodiment 1.

EMBODIMENT 2

A pattern formation method according to Embodiment 2 of the invention, and more specifically, a pattern formation method using the photomask of Embodiment 1 (hereinafter referred to as the photomask of the invention) will now be described with reference to the accompanying drawings.

FIGS. 15A through 15D are cross-sectional views for showing procedures in the pattern formation method of Embodiment 2.

Figure 15:
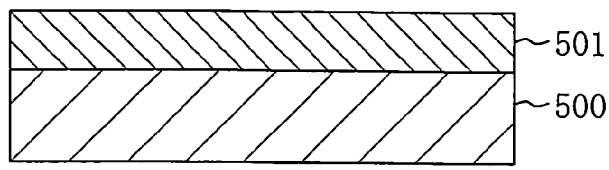
FIGS. 15A, 15B, 15C and 15D are cross-sectional views for showing procedures in a pattern formation method according to Embodiment 2 of the invention.
Figure 15:
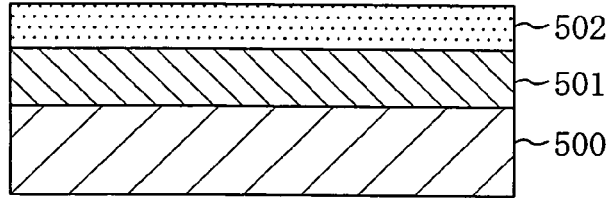
Figure 15:
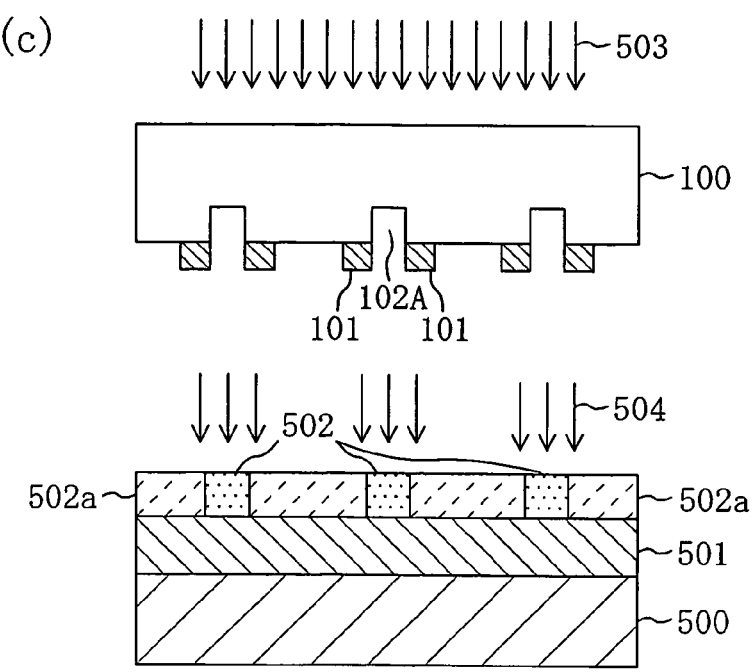
Figure 15:
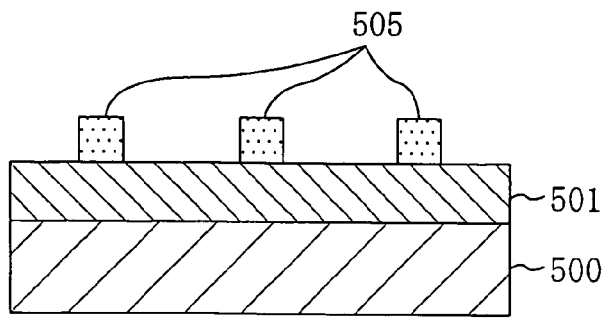

First, as shown in FIG. 15A, a target film 501 of, for example, a metal film or an insulating film is formed on a substrate 500, and thereafter, a positive resist film 502 is formed on the target film 501 as shown in FIG. 15B.

Next, as shown in FIG. 15C, the photomask of this invention such as the photomask of Embodiment 1 shown in FIG. 3B is irradiated with exposing light 503, so as to expose the resist film 502 to transmitted light 504 having passed through the photomask.

It is noted that line-shaped mask patterns to be transferred through the exposure are provided on a transparent substrate 100 of the photomask used in the procedure of FIG. 15C. The mask patterns are made of a shielding portion 101 alone or a combination of the shielding portion 101 and a phase shifter 102. Furthermore, the phase shifter 102 is formed so as to be surrounded with the shielding portion 101. In other words, the mask pattern has the mask enhancer structure composed of the shielding portion 101 and the phase shifter 102. Also, the phase shifter 102 is formed by, for example, trenching the transparent substrate 100.

Furthermore, in the exposure procedure shown in FIG. 15C, the resist film 502 is subjected to the exposure by using, for example, an oblique incident exposure light source. In this case, as shown in FIG. 15C, merely a latent image portion 502a of the resist film 502 corresponding to a region excluding the mask patterns is irradiated at exposure energy sufficiently high for allowing the resist to dissolve in development.

Next, the resist film 502 is developed so as to remove the latent image portion S02a, thereby forming resist patterns 505 corresponding to the mask patterns as shown in FIG. 15D.

Since the photomask of this invention (specifically, the photomask of Embodiment 1) is used in the pattern formation method of Embodiment 2, the same effects as those attained in Embodiment 1 can be attained. Also, when the substrate (the wafer) on which the resist is applied is subjected to the oblique incident exposure through the photomask of this invention, the portion of the resist corresponding to the region excluding the mask enhancer is irradiated at the exposure energy sufficiently high for allowing the resist to dissolve in the development because the mask enhancer including the phase shifter (an opening) 102 has a very high shielding property. Furthermore, contrast of a shielded image formed by the mask enhancer is very high and the shielded image has a good defocus characteristic, and therefore, fine pattern formation with a high DOF can be realized.

Although the photomask having the mask enhancer structure composed of the shielding portion 101 and the phase shifter 102 is used in Embodiment 2, a photomask having the mask enhancer structure composed of a semi-shielding portion and a phase shifter may be used instead.

Furthermore, although the positive resist process is employed in Embodiment 2, the same effects can be attained by employing negative resist process.

Also, in Embodiment 2, the oblique incident illumination (oblique incident exposure) is preferably employed in the procedure for irradiating with the exposing light shown in FIG. 15C. Thus, the contrast between portions respectively corresponding to the mask pattern and the transparent portion is improved in a light intensity distribution of the light passing through the photomask of this invention. Furthermore, the focus characteristic of the light intensity distribution is also improved. Accordingly, the exposure margin and the focus margin are improved in the pattern formation. In other words, fine pattern formation with good defocus characteristics can be realized. Moreover, even in the case where patterns having the mask enhancer structure are close to each other on the photomask, the contrast of the respective patterns is largely improved in the exposure.

Figure 16:
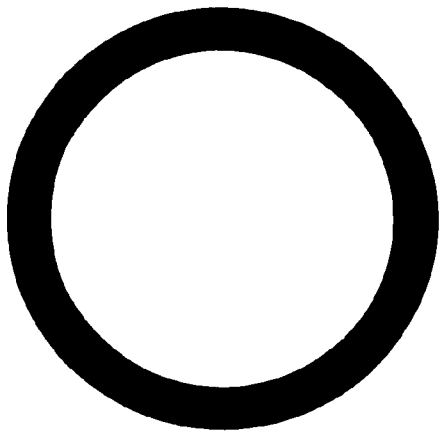
FIG. 16A is a diagram of a general exposure light source.
FIG. 16B is a diagram of an annular exposure light source.
FIG. 16C is a diagram of a quadrupole exposure light source and FIG. 16D is a diagram of an annular/quadrupole exposure light source.
Figure 16:
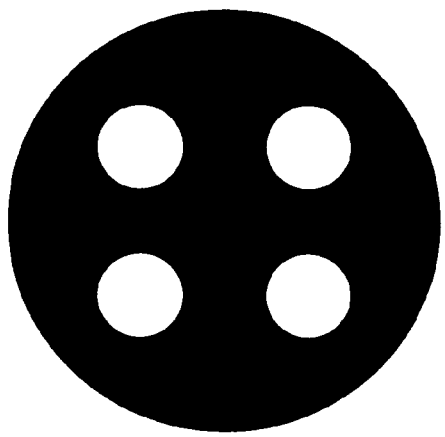
Figure 16:
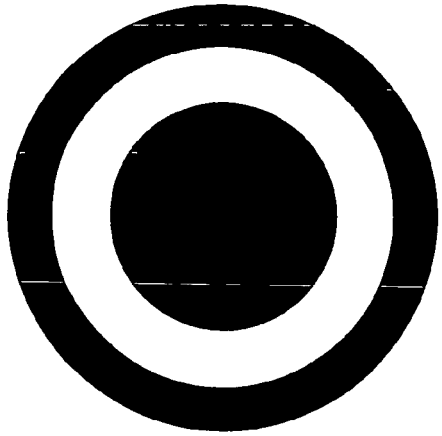
Figure 16:
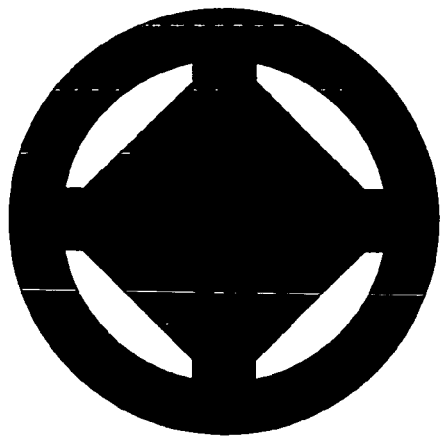

Herein, a light source for the oblique incident exposure means a light source as shown in any of FIGS. 16B through 16D obtained by removing a vertical incident component (a component of the exposing light vertically entering the photomask from the light source) from a general exposure light source of FIG. 16A. Typical examples of the light source for the oblique incident exposure are an annular exposure light source of FIG. 16B and a quadrupole exposure light source of FIG. 16C. Although slightly depending upon a target pattern, the quadrupole exposure light source is generally more effectively used than the annular exposure light source for improving the contrast and increasing the DOF. However, the quadrupole exposure has a side effect to, for example, distort a pattern shape against a mask shape, and hence in such a case, an annular/quadrupole exposure light source of FIG. 16D is preferably used. As a characteristic of this annular/quadrupole exposure light source, assuming the XY coordinate system with the center of the light source (the center of a general exposure light source) corresponding to the origin, the annular/quadrupole exposure light source has a characteristic of the quadrupole exposure light source since portions at the center and on the X and Y axes of the light source are removed, and has a characteristic of the annular exposure light source since the outline of the light source is in a circular shape.

EMBODIMENT 3

A mask data generation method according to Embodiment 3 of the invention, and more specifically, a mask data generation method for the photomask of Embodiment 1 (hereinafter referred to as the photomask of this invention) will now be described with reference to the accompanying drawings. It is noted in this embodiment that the functions, the characteristics and the like of respective elements of the photomask are the same as those of the corresponding elements of the aforementioned photomask of this invention unless otherwise mentioned.

Before describing specific process contents, significant points of the mask data generation method for the photomask of this invention will be described. In the case where pattern formation is carried out by using a mask pattern having the mask enhancer structure, the width of a phase shifter and the width of a shielding portion or a semi-shielding portion surrounding the phase shifter in the mask enhancer structure affect even in forming one isolated pattern. Therefore, it is necessary to determine a plurality of element values such as the width of the phase shifter and the width of the shielding portion or the semi-shielding portion for attaining a desired value as a dimension of a pattern to be formed, namely, a CD (critical dimension). Furthermore, in many cases, there are not only one but a plurality of combinations of the element values for realizing the desired CD. Accordingly, in this embodiment, elements significant for maximizing a margin in the pattern formation are priorly determined, and thereafter, the pattern dimension is adjusted by using elements less affecting the margin in the pattern formation.

Specifically, it is preferred that the layout position and the width of the phase shifter are first determined as elements largely affecting the margin in the pattern formation, and thereafter, the width of the shielding portion or the semi-shielding portion surrounding the phase shifter, namely, the width of a region sandwiched between the phase shifter and a transparent portion, is adjusted so as to generate mask data for realizing a desired CD. Through such mask data generation, while attaining highly precise pattern dimension control, mask data for realizing a photomask for attaining a large margin in the pattern formation can be generated. Now, the specific process contents will be described.

Figure 17:
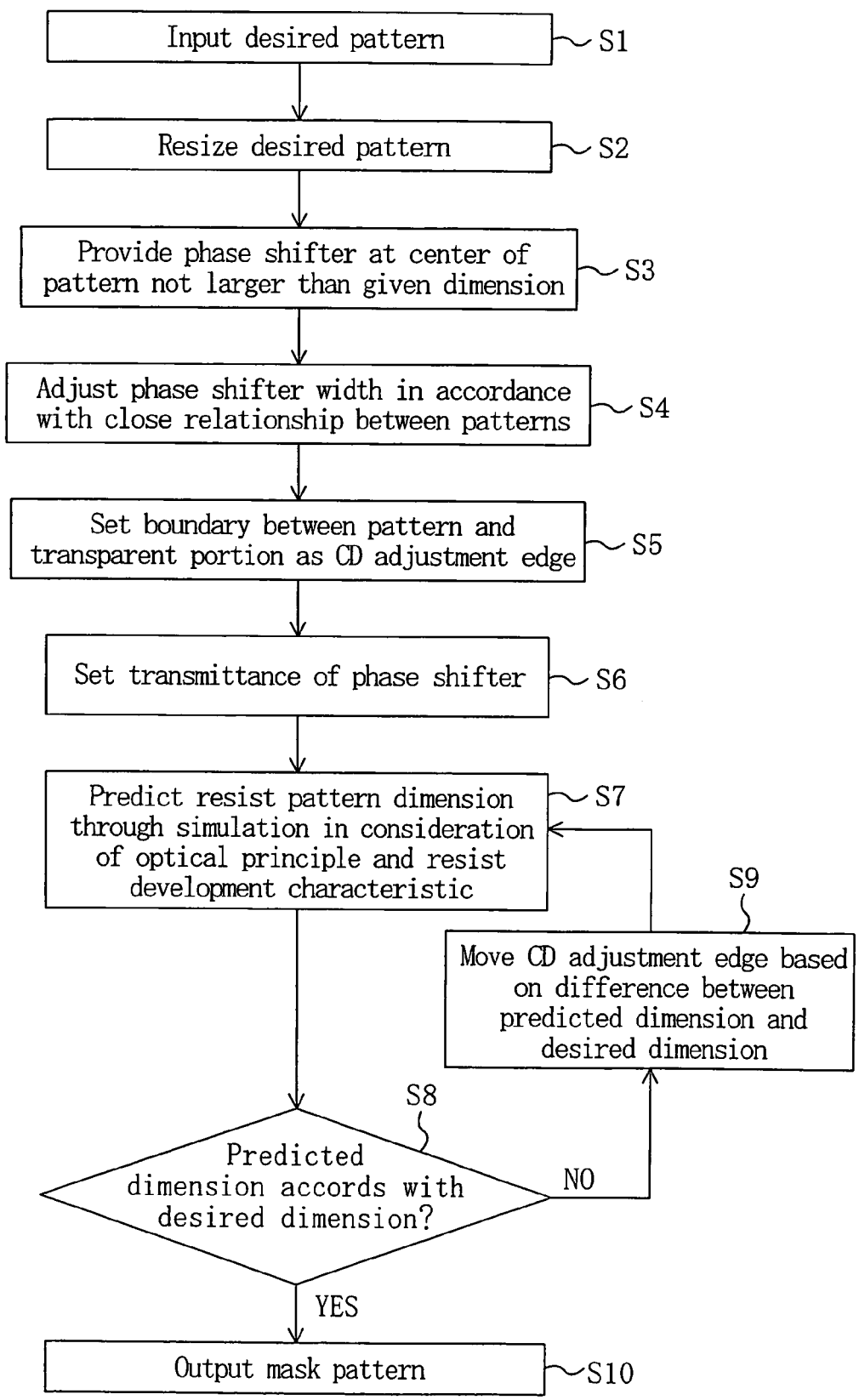
FIG. 17 is a flowchart for a mask data generation method according to Embodiment 3 of the invention.

FIG. 17 is a flowchart of the mask data generation method of Embodiment 3, and more specifically, a method for generating LSI mask patterns corresponding to shielding patterns on a mask on the basis of fine desired patterns. Also, FIGS. 18A through 18F are diagrams of examples of specific mask patterns generated in the respective procedures in the mask data generation method of Embodiment 3.

Figure 18:
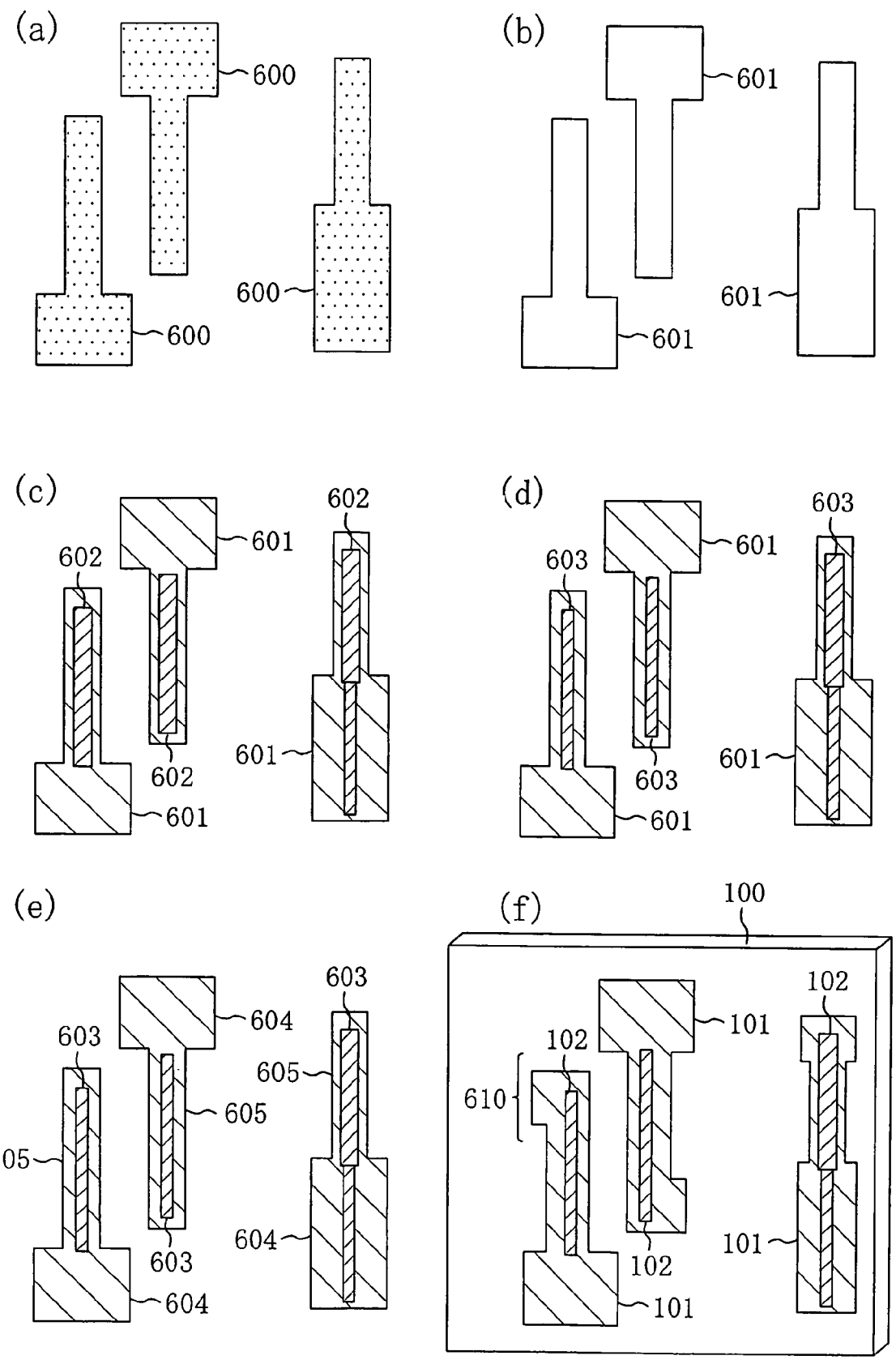
FIG. 18A, 18B, 18C, 18D, 18E and 18F are diagrams for showing specific mask patterns generated in respective procedures in the mask data generation method of Embodiment 3.
Figure 19:
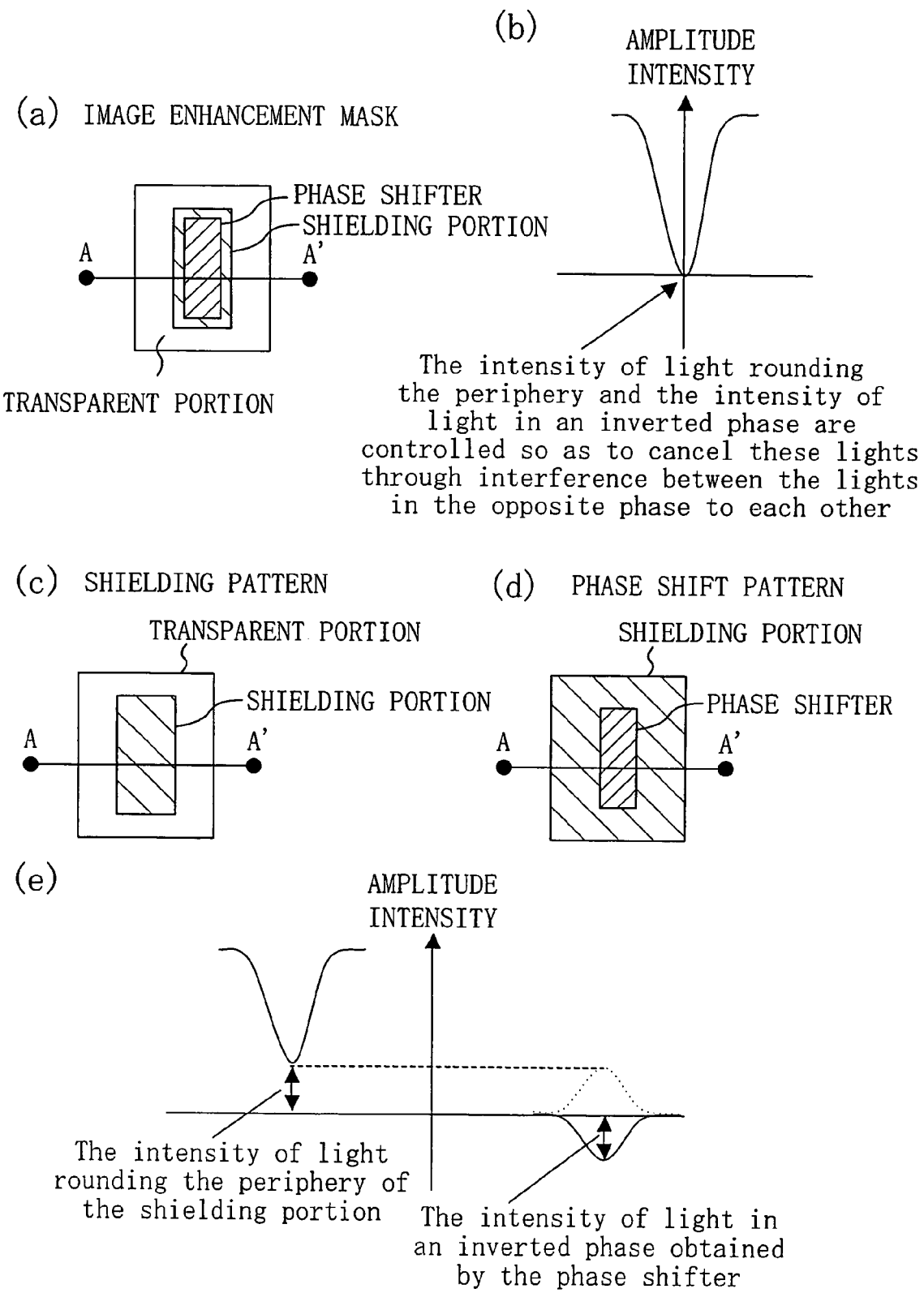
FIGS. 19A, 19B, 19C, 19D and 19E are diagrams for explaining a contrast enhancement effect attained by the mask enhancer structure found by the present inventor.

FIG. 18A shows desired patterns to be formed by using mask patterns. In other words, patterns 600 of FIG. 18A are patterns corresponding to regions where a resist is not to be exposed in the exposure using the photomask of the invention (desired unexposed regions). In the description of the pattern formation in this embodiment, the positive resist process is premised to employ unless otherwise mentioned. Specifically, the description is given on the assumption that an exposed portion of a resist is removed through development so as to allow an unexposed portion of the resist to remain as a resist pattern. Accordingly, in the case where the negative resist process is employed, mask data can be generated basically in the same manner as in this embodiment by regarding that an exposed portion of a resist remains as a resist pattern with an unexposed portion of the resist removed.

First, in step S1, the desired patterns 600 of FIG. 18A are input to a computer used for the mask data generation.

Next, in step S2, the desired patterns of FIG. 18A are resized to be enlarged or reduced depending upon whether over-exposure or under-exposure is performed in the exposure of the created photomask. Alternatively, the patterns may be resized for intentionally adjusting dimensions at the stage of lithography in consideration of dimensional change occurring in various processes performed after the pattern formation such as dry etching and CMP. FIG. 18B shows patterns (shielding patterns) 601 resulting from the resizing.

Then, in step S3, a phase shift pattern 602 is generated at the center of a region, having a dimension (a width) not larger than a given value, of each pattern 601 as shown in FIG. 18C.

Specifically, the shape (the layout position, the width and the like, which also applies the following description) of a phase shifter included in the mask enhancer structure is determined. At this point, the phase shift pattern 602 is completely contained within the pattern 601, namely, within the shielding pattern. In this embodiment, it is assumed that each pattern 601 is composed of a plurality of independent line-shaped patterns and that the width of the pattern 601 means a line width thereof (which also applies to the width of the phase shift pattern 602). A line-shaped pattern herein means not only a pattern having a line-shaped outline but also a rectangular region included in an arbitrary pattern and having a length not smaller than twice of the wavelength of exposing light. Also, a distance between patterns means not only a distance between patterns separated from each other but the width of a transparent portion sandwiched between line-shaped rectangular regions in a pattern such as the frame-like pattern 113 shown in FIG. 2 (a frame-shaped pattern) is also defined as a distance between patterns.

The width of the phase shift pattern 602 can be set, for example, as follows: At least one given dimension W0 is determined, and a phase shift pattern 602 with a width of a given dimension F0 (W0>F0) is disposed in a region, having a width not larger than the dimension W0, of the pattern 602. Also, preferably at least two given dimensions W0 and W1 (W0>W1) are determined, and a phase shift pattern 602 with a width of the given dimension F0 is disposed in a region, having a width larger than the dimension W1 and not larger than the dimension W0, of the pattern 601 and a phase shift pattern 602 with a width of a given dimension F1 (F1>F0) is disposed in a region, having a width not larger than the dimension W1, of the pattern 601. Furthermore, in consideration of the principle of the mask enhancer, it goes without saying that a method in which three or more given dimensions (W0, W1, W2, . . . etc.: W0>W1>W2 . . . etc.) are determined and a phase shift pattern with a larger width is provided in a region, having a width not larger than the dimension W0, of the pattern 601 as the width of the region is smaller (in other words, a thinner phase shift pattern is provided as the width of a mask pattern is larger) is preferred.

Next, in step S4, the width of each phase shift pattern 602 is adjusted in accordance with the close relationship between the line-shaped patterns included in the patterns 601 as shown in FIG. 18D. Specifically, the width of the phase shift pattern 602 provided in one line-shaped pattern is adjusted on the basis of a distance from this line-shaped pattern to a different line-shaped pattern close to it with a transparent portion (a region where no pattern 601 is present in this embodiment) sandwiched therebetween. In FIG. 18D, a phase shift pattern 603 is a phase shift pattern having been adjusted in the dimension.

The specific method for adjusting the width of the phase shift pattern is as follows: At least one given distance S0 is determined, and when the line-shaped pattern including the phase shift pattern to be adjusted (a target pattern) is not close to a different line-shaped pattern (a different pattern) at a distance not larger than the distance S0, the width of the phase shift pattern is set to F0A, and when the target pattern is close to a different pattern at a distance not larger than the distance S0, the width of the phase shift pattern is set to F0B (F0A>F0B). Also, preferably at least two given distances S0 and S1 (S0>S1) are determined, and when the target pattern is not close to a different pattern at a distance not larger than the distance S0, the width of the phase shift pattern is set to F0A, when the target pattern is close to a different pattern at a distance larger than the distance S1 and not larger than the distance S0, the width of the phase shift pattern is set to F0B, and when the target pattern is close to a different pattern at a distance not larger than the distance S1, the width of the phase shift pattern is set to F0C (F0B>F0C). Furthermore, as described in Embodiment 1, it goes without saying that a method in which three or more given distances (S0, S1, S2, ... etc.: S0>S1>S2 ... etc.) are determined and the width of a phase shift pattern is set to be smaller as the distance between the target pattern and a different pattern is smaller is preferred.

Furthermore, in addition to the aforementioned adjustment of the width of the phase shift pattern, the width of the phase shift pattern is preferably adjusted as follows in accordance with whether a different pattern close to the target pattern is a simple shielding pattern or a pattern having the mask enhancer structure including a phase shift pattern: Whether or not a phase shift pattern is also disposed in a different pattern close to the target pattern in which the phase shift pattern is disposed can be determined depending upon the width of the different pattern. Accordingly, in the case where a different close pattern has a width larger than the given dimension W0 (namely, in the case where a phase shift pattern is not disposed in the different pattern), the width of the phase shift pattern disposed in the target pattern is set to F0B, and in the case where the different close pattern has a width not larger than the given dimension W0 (namely, in the case where a phase shift pattern is disposed in the different pattern), the width of the phase shift pattern disposed in the target pattern is set to F0M (F0B>F0M).

Moreover, in the case where there are different close patterns on respective sides of the target pattern, the width of the phase shift pattern is preferably adjusted as follows: Distances S1 and S2 from the respective different patterns close on the sides of the target pattern to the target pattern are obtained, and the width of the phase shift pattern is set to be smaller when a value (S1+S2)/2 is not larger than a given value than when the value (S1+S2)/2 is larger than the given value. Alternatively, in consideration that distances to the different patterns disposed on the side of the target pattern are preferably averaged in evaluation of the distances between the target pattern and the different patterns in the adjustment of the width of the phase shift pattern, the following adjustment may be employed in stead of the aforementioned adjustment: In the case where a distance to, for example, a different pattern disposed on the left hand side of the target pattern is a distance S1 and a distance to a different pattern disposed on the right hand side of the target pattern is a distance S2, the width of the phase shift pattern provided in the target pattern is assumed to be F. Also, in the case where distances to the different patterns disposed on the respective sides of the target pattern are both a distance S1, the width of the phase shift pattern provided in the target pattern is assumed to be F1, and in the case where distances to the different patterns disposed on the respective sides of the target pattern are both a distance S2, the width of the phase shift pattern provided in the target pattern is assumed to be F2. On these assumption, the width of the phase shift pattern is preferably adjusted so that F=(F1+F2)/2. Furthermore, in the aforementioned averaging, when the distance S1 or S2 is not smaller than the given distance S0, the distances are preferably averaged by regarding the distance S1 or S2 as the distance S0.

Through the aforementioned processes in steps S3 and S4, the layout position and the width of a phase shifter largely affecting the margin in the pattern formation can be optimally determined.

Next, in step S5, on the basis of the shape of the phase shift pattern 603 determined up to step S4, a shielding pattern 604 corresponding a portion of the pattern (the shielding pattern) 601 excluding the phase shift pattern 603 is defined as shown in FIG. 18E. Subsequently, preparations are made for a process to adjust the dimension of the mask pattern so as to form a pattern with a desired dimension correspondingly to the mask pattern through the exposure by using the photomask fabricated by the mask data generation method of this embodiment (the photomask of this invention). Specifically, preparations are made for processing generally designated as OPC (optical proximity correction). In this embodiment, the boundary between a shielding portion and a transparent portion alone is moved in adjusting the dimension of the mask pattern on the basis of a predicted dimension obtained in the pattern formation (the dimension of a resist pattern), namely, a predicted CD. Therefore, in step S5, an edge corresponding to the boundary of the shielding pattern 604 with the transparent portion is set as a CD adjustment edge 605. Thus, the CD can be adjusted in accordance with the width of the shielding pattern 604 sandwiched between the phase shift pattern 603 and the transparent portion in the pattern region where the phase shift pattern 603 is disposed. Accordingly, without deforming the phase shift pattern 603 whose width has been adjusted in accordance with the close relationship between patterns, a mask pattern for realizing the desired CD can be generated. It goes without saying that the shielding pattern 604 may be replaced with a semi-shielding pattern.

Next, in step S6, the transmittance of the phase shift pattern 603 disposed in the mask pattern, namely, the transmittance of the phase shifter, is set.

Then, in steps S7, S8 and S9, the OPC processing (such as model base OPC processing) is carried out. Specifically, in step S7, a dimension of a resist pattern formed in the exposure by using the pattern including the shielding pattern 604 and the phase shift pattern 603 is predicted through simulation performed in consideration of the optical principle and a resist development characteristic. At this point, not only the lithography but also other processes related to the pattern formation such as dry etching may be taken into consideration in the simulation. Subsequently, in step S8, it is determined whether or not the predicted dimension of the resist pattern accords with a desired dimension. When the predicted dimension does not accord with the desired dimension, the CD adjustment edge 605 is moved in step S9 on the basis of a difference between the predicted dimension of the resist pattern and the desired dimension, so as to deform the shielding pattern 604, namely, the mask pattern.

Since the phase shift pattern is previously generated in this embodiment, if the width of the phase shift pattern is inappropriately set in steps S3 and S4, the desired CD cannot be obtained in steps S7 through S9. In such a case, the inappropriate width of the phase shift pattern may be corrected. It is noted that an inappropriate phase shifter is a phase shifter that makes a predicted CD larger than a desired CD even when the width of a shielding portion surrounding the phase shifter is 0. Therefore, when the inappropriate phase shifter has been generated, a desired CD cannot be obtained unless the width of the phase shifter is reduced. Accordingly, the line width of the phase shift pattern generated in steps S3 and S4 is preferably set so that a predicted CD cannot exceed a desired CD even when there is no shielding portion around the phase shift pattern. When such a phase shift pattern is generated, there is no need to correct the phase shift pattern in carrying out the processes of steps S7 through S9. At this point, the maximum width of a phase shifter that does not make a predicted CD exceed a desired CD when the mask pattern is composed of the phase shifter alone is designated as a maximum phase shifter width against a CD value. Specifically, the width of the phase shift pattern generated in steps S3 and S4 is preferably set not to exceed the maximum phase shifter width against the CD value. It is noted that the maximum phase shifter width against the CD value can be easily obtained through simulation or the like after determining the transmittance of the phase shifter and exposing conditions.

As described so far, as a characteristic of this embodiment, a mask pattern capable of forming a resist pattern with a desired dimension is realized by changing merely the CD adjustment edge 605 set in step S5 in the phase shift pattern 603 determined up to step S4. In other words, when the processes of steps S7 through S9 are repeated until the predicted dimension of the resist pattern accords with the desired dimension, a mask pattern capable of forming a resist pattern with a desired dimension is ultimately output in step S1. FIG. 18F shows an example of the mask pattern output in step S10. As shown in FIG. 18F, a shielding portion 101 made of a Cr film or the like is formed in a region corresponding to the shielding pattern 604 on a transparent substrate 100. Also, a phase shifter 102 formed by, for example, trenching the transparent substrate 100 is formed in a region corresponding to the phase shift pattern 603 on the transparent substrate 100.

In FIG. 18F, an end portion 610 of the line-shaped pattern having the mask enhancer structure composed of the shielding portion 101 and the phase shifter 102 is in a hammer-like shape with a large width, which shape is employed for preventing the resist pattern corresponding to the line end portion 610 from receding. Also, in such a line end portion in a hammer-like shape, even when its line width exceeds the given value, a phase shifter for improving the shielding property may be disposed at its center. This is for the following reason: In a general line pattern, light rounds along two directions (in directions vertical to the line direction) through transparent portions disposed on respective sides, but in a line end portion, light rounds along not only the two directions but also through a transparent portion disposed on an end side of the line, namely, along three directions. Therefore, a phase shifter can be disposed even when it has a width exceeding the given dimension.

As described above, according to Embodiment 3, in order to realize a mask good at significant pattern formation characteristics such as contrast, the width and the layout position of a phase shift pattern, that is, significant parameters, are first determined. Thereafter, merely the outermost edge of the pattern 601 set as the CD adjustment edge 605 is moved for the pattern dimension control. Therefore, a mask pattern capable of forming a desired fine pattern without changing the width and the like of the phase shift pattern once determined, namely, while retaining conditions for exhibiting the good pattern formation characteristics, can be realized. In other words, a mask pattern capable of forming a desired fine pattern and having the good pattern formation characteristics can be realized.

Furthermore, according to Embodiment 3, the width of the phase shifter of the mask enhancer structure is adjusted on the basis of a distance from a different close pattern to the pattern having the mask enhancer structure (the target pattern). Specifically, the width of the phase shifter is reduced as the distance from the different pattern is smaller. Therefore, in accordance with the degree at which light (in an identical phase with respect to a transparent portion) rounding to the back side of the target pattern through the transparent portion disposed around the target pattern is reduced owing to the presence of the different pattern, light (in an opposite phase with respect to the transparent portion) passing through the inside of the target pattern (the phase shifter) can be reduced. Accordingly, the shielding property of the target pattern can be sufficiently improved, so that the exposure margin can be increased and the contrast in a light intensity distribution formed in the exposure can be improved. Specifically, in a photomask including not only an isolated pattern but also complicated patterns close to one another, the good pattern formation characteristics can be realized. Also, since the width of the phase shifter of the mask enhancer structure can be optimized in accordance with the close relationship between patterns, a photomask capable of fine pattern formation with random pattern layout can be realized.

Although the mask pattern having the mask enhancer structure using a shielding portion is described in Embodiment 3, this embodiment may be applied to a mask pattern having the mask enhancer structure using a semi-shielding portion instead. Specifically, portions described as the shielding portion of the mask enhancer structure in this embodiment may be all replaced with semi-shielding portions.

Moreover, in each of Embodiments 1 through 3, the description is given with respect to a transmission photomask, which does not limit the invention. The present invention is applicable to a reflection mask by replacing all the transmission phenomenon of exposing light with the reflection phenomenon by, for example, replacing the transmittance with reflectance.

INDUSTRIAL APPLICABILITY

As described so far, the present invention relates to a photomask, a pattern formation method and a mask data generation method using the photomask, and is useful particularly for, for example, application to fine pattern formation employed in fabrication of a semiconductor integrated circuit device or the like.

The invention claimed is:
1. A photomask comprising:
a mask pattern formed on a transparent substrate and having a light shielding property with respect to exposing light; and
a transparent portion of said transparent substrate where said mask pattern is not formed,
wherein said transparent portion surrounds said mask pattern,
said mask pattern includes a first pattern and a second pattern each having a line shape and having a mask enhancer structure including a phase shifter for transmitting said exposing light in an opposite phase with respect to said transparent portion and a shielding portion surrounding said phase shifter, and a third pattern located adjacent to said first pattern along a direction vertical to the line direction of said first pattern, at a distance not larger than a given distance and with a transparent portion sandwiched between said first pattern and said third pattern,
an end portion of said first mask pattern and an end portion of said second mask pattern are surrounded by said transparent portion in three directions of the end portion of the first mask pattern and the end portion of the second mask pattern,
the outermost region in said mask pattern is said shielding portion, and the outmost region of said third pattern is a shielding pattern,
a first phase shifter in said first pattern is a line-shaped pattern having a first line width with a predetermined width,
a second phase shifter in said second pattern is a line-shaped pattern having a second line width with a predetermined width, said first line width is smaller than said second line width, and a pattern width of said first pattern in a short side direction is the same as a pattern width of said second pattern in a short side direction.

2. The photomask of claim 1, wherein each of regions of said transparent portion disposed on both sides of said second pattern has a width larger than a given dimension.

3. The photomask of claim 2, wherein said third pattern has the mask enhancer structure or is made of a shielding portion.

4. The photomask of claim 3, wherein said third pattern is provided with a semi-shielding portion for partially transmitting the exposing light in an identical phase with respect to said transparent portion instead of said shielding portion of the mask enhancer structure.

5. The photomask of claim 1,
wherein said mask pattern further comprises a fourth pattern,
said fourth pattern is located adjacent to said second pattern at a distance not larger than said given distance with said transparent portion sandwiched between said fourth pattern and said second pattern along a direction vertical to the line direction of said second pattern, and
the distance between said second pattern and said fourth pattern is larger than the distance between said first pattern and said third pattern.

6. The photomask of claim 5, wherein each of said third pattern and said fourth pattern has the mask enhancer structure or is made of a shielding portion.

7. The photomask of claim 6, wherein each of said third pattern and said fourth pattern is provided with a semi-shielding portion for partially transmitting the exposing light in an identical phase with respect to said transparent portion instead of said shielding portion of the mask enhancer structure.

8. The photomask of claim 1, wherein said first pattern and said second pattern are connected to each other, thereby forming one continuous pattern.

9. The photomask of claim 1, wherein said given distance is not larger than $(\lambda/NA) \times M$, wherein $\lambda$ indicates a wavelength of the exposing light and M and NA respectively indicate a reduction ratio and numerical aperture of a reduction projection optical system of a projection aligner.

10. The photomask of claim 1, wherein each of said first pattern and said second pattern has a pattern width not larger than $(0.8 \times \lambda/NA) \times M$, wherein $\lambda$ indicates a wavelength of the exposing light and M and NA respectively indicate a reduction ratio and numerical aperture of a reduction projection optical system of a projection aligner.

11. The photomask of claim 1, wherein each of said first pattern and said second pattern is provided with a semi-shielding portion for partially transmitting the exposing light in an identical phase with respect to said transparent portion instead of said shielding portion of the mask enhancer structure.

12. The photomask of claim 11, wherein said semi-shielding portion transmits the exposing light with a phase difference not less than $(-30+360 \times n)$ degrees and not more than $(30+360 \times n)$ degrees (wherein n is an integer) with respect to said transparent portion.

13. The photomask of claim 11, wherein said semi-shielding portion is made of a metal thin film with a thickness of 30 nm or less.

14. The photomask of claim 1, wherein said first phase shifter and said second phase shifter transmit the exposing light with a phase difference not less than $(150+360 \times n)$ degrees and not more than $(210+360 \times n)$ degrees (wherein n is an integer) with respect to said transparent portion.

15. The photomask of claim 1, wherein said first phase shifter and said second phase shifter are formed by trenching said transparent substrate.

16. The photomask of claim 1, wherein said third pattern is another pattern separated from said first and second patterns.

17. The photomask of claim 1, wherein each of said first and second patterns has a length of $2 \times \lambda \times M$ or more, wherein $\lambda$ indicates a wavelength of the exposing light and M indicates a reduction ratio of a reduction projection optical system of a projection aligner.

18. A pattern formation method using the photomask of claim 1, comprising the steps of:
forming a resist film on a substrate;
irradiating said resist film with the exposing light through said photomask; and
forming a resist pattern by developing said resist film having been irradiated with the exposing light.

19. The pattern formation method of claim 18,
wherein oblique incident illumination is employed in the step of irradiating said resist film with the exposing light.

* * * * *